US008174302B2

(12) United States Patent
Fujiwara

(10) Patent No.: US 8,174,302 B2
(45) Date of Patent: May 8, 2012

(54) PULSE SIGNAL GENERATOR, AND METHOD OF GENERATING PULSE SIGNAL

(75) Inventor: Yasuyuki Fujiwara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 103 days.

(21) Appl. No.: 12/461,771

(22) Filed: Aug. 24, 2009

(65) Prior Publication Data
US 2010/0052760 A1    Mar. 4, 2010

(30) Foreign Application Priority Data

Aug. 26, 2008  (JP) ................. 2008-216255

(51) Int. Cl.
G06F 1/04 (2006.01)
H03K 3/00 (2006.01)
(52) U.S. Cl. .................. 327/291; 327/172; 327/175
(58) Field of Classification Search ............ 327/291
See application file for complete search history.

(56) References Cited

U.S. PATENT DOCUMENTS

| 4,386,302 | A | * | 5/1983 | Iwasawa | 388/811 |
| 5,675,297 | A | * | 10/1997 | Gose et al. | 332/109 |
| 6,342,822 | B1 | * | 1/2002 | So | 332/109 |
| 6,448,827 | B1 | * | 9/2002 | Tojima | 327/172 |
| 6,552,919 | B1 | * | 4/2003 | Bors | 363/42 |
| 7,017,069 | B2 | * | 3/2006 | Kudo et al. | 713/500 |
| 7,646,808 | B2 | * | 1/2010 | Kris et al. | 375/238 |
| 7,791,386 | B2 | * | 9/2010 | Kris | 327/160 |
| 2004/0242540 | A1 | * | 12/2004 | Asrar et al. | 514/63 |
| 2006/0238231 | A1 | * | 10/2006 | Mutaguchi | 327/291 |
| 2008/0130134 | A1 | * | 6/2008 | Ishida et al. | 359/698 |
| 2010/0134168 | A1 | * | 6/2010 | Kris | 327/175 |

FOREIGN PATENT DOCUMENTS

| JP | 5-260798 | 10/1993 |
| JP | 2002-141787 | 5/2002 |

* cited by examiner

*Primary Examiner* — Ryan Jager
(74) *Attorney, Agent, or Firm* — McGinn IP Law Group, PLLC

(57) ABSTRACT

A pulse signal generator includes a period setting unit that receives a period set signal including an information indicative of a pulse period, and that outputs a period control signal controlling the pulse period, a duty ratio setting unit that receives a duty ratio set signal including an information indicative of a duty ratio of a pulse, that receives a signal including the pulse period set in the period setting unit, and that generates a duty ratio control signal controlling the duty ratio of the pulse on a basis of the pulse period and the duty ratio set signal, and a pulse generation unit that generates a pulse signal including the pulse period and the duty ratio of the pulse on a basis of the period control signal and the duty ratio control signal.

20 Claims, 20 Drawing Sheets

※ $V_{in}$ : COINCIDENCE SIGNAL FROM PERIOD SETTING UNIT
  $V_{ref}$ : $V_{in}$ (MINIMUM VALUE) < $V_{ref}$ < $V_{in}$ (MAXIMUM VALUE)
  $R_1 \gg R_2$ ※ $V_{in}$ : COINCIDENCE SIGNAL FROM PERIOD SETTING UNIT
   $V_{ref}$ : $V_{in}$ (MINIMUM VALUE) < $V_{ref}$ < $V_{in}$ (MAXIMUM VALUE)

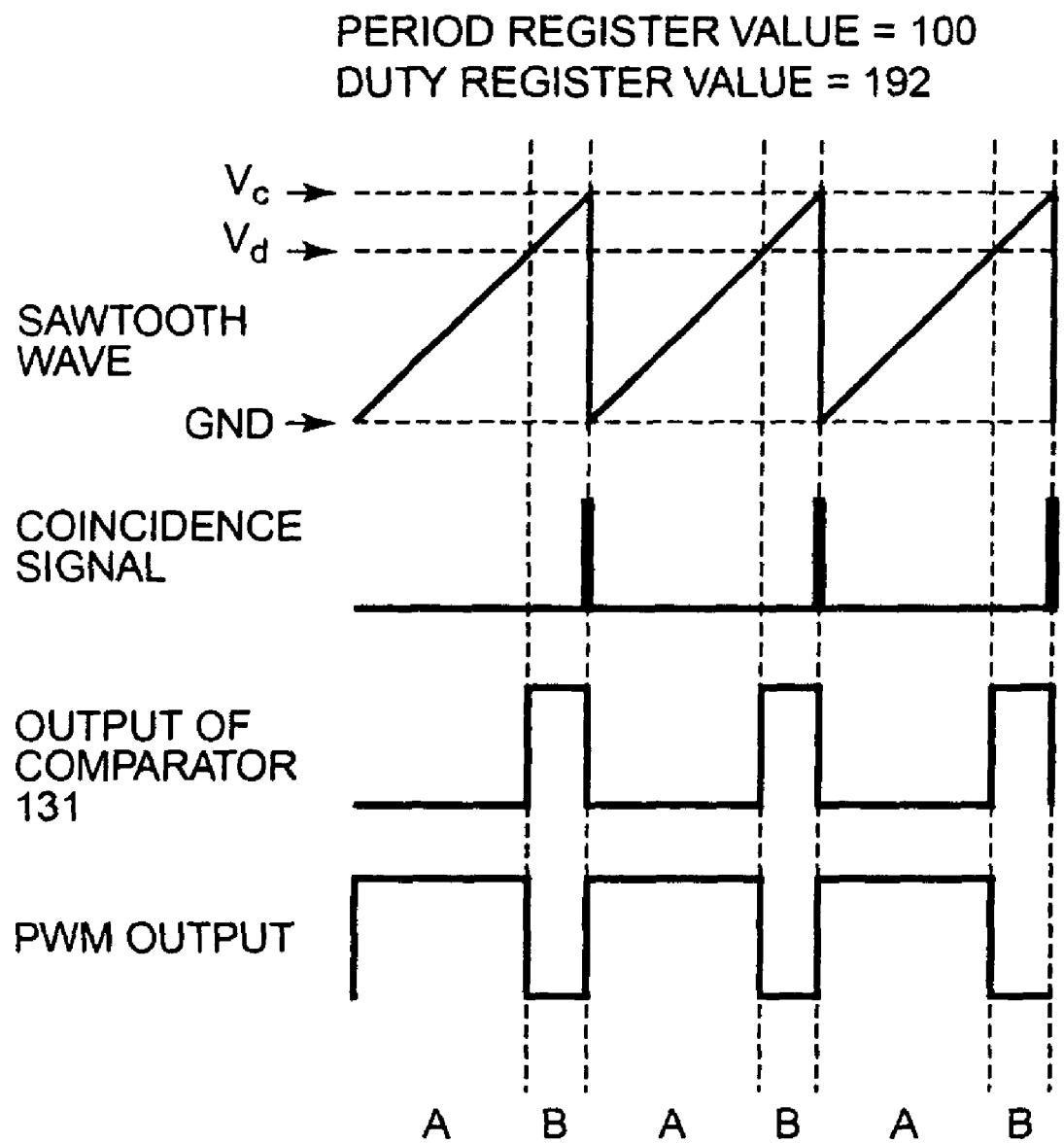

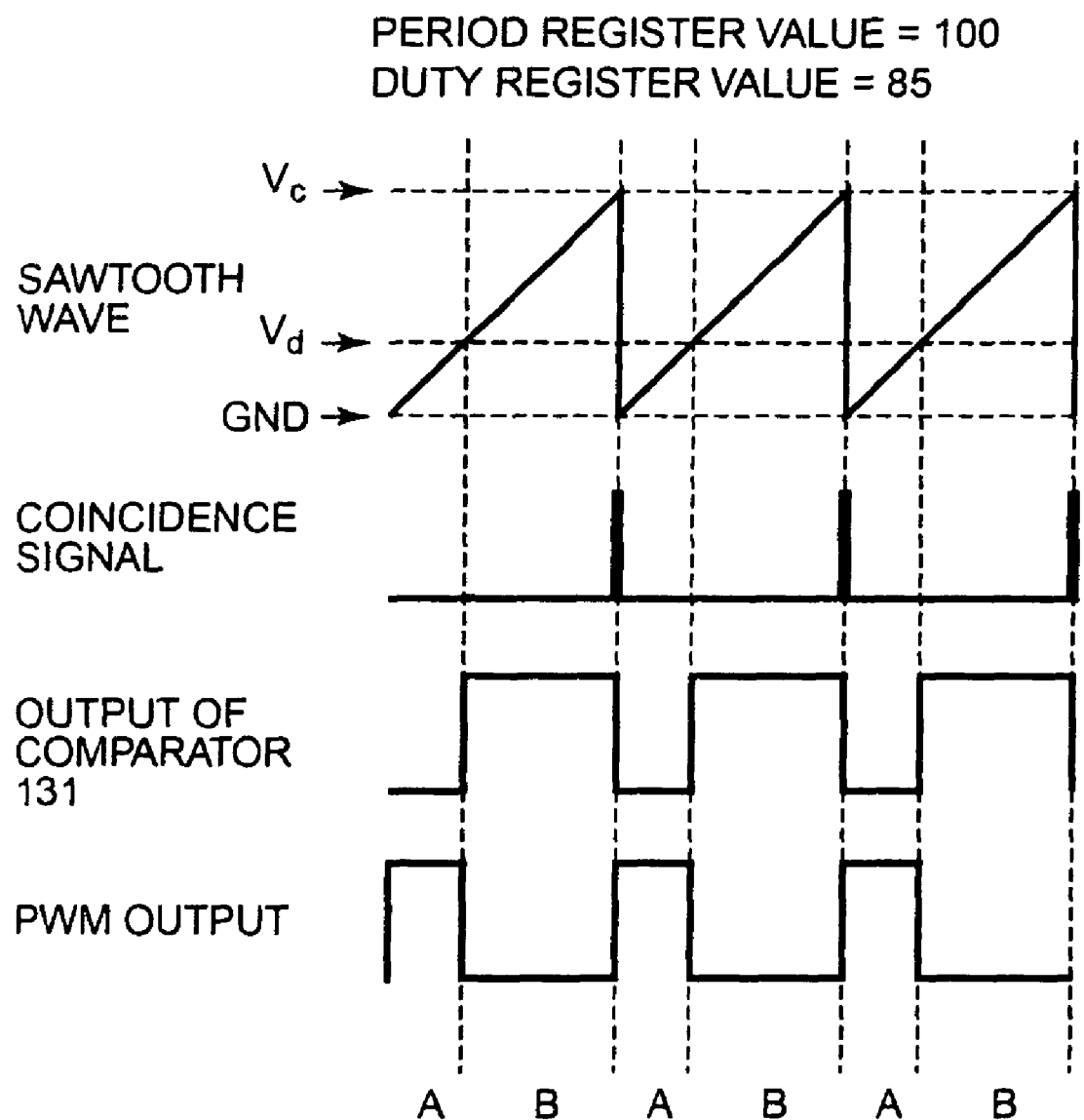

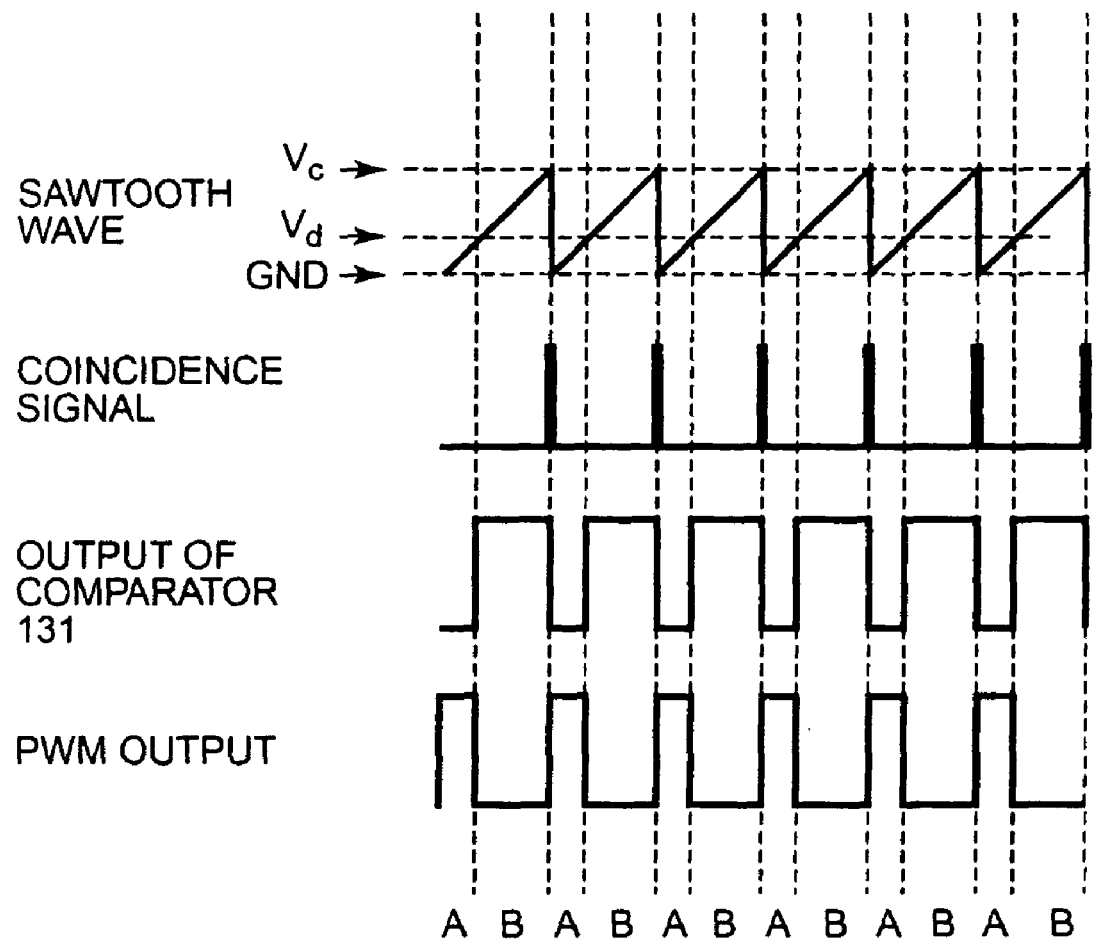

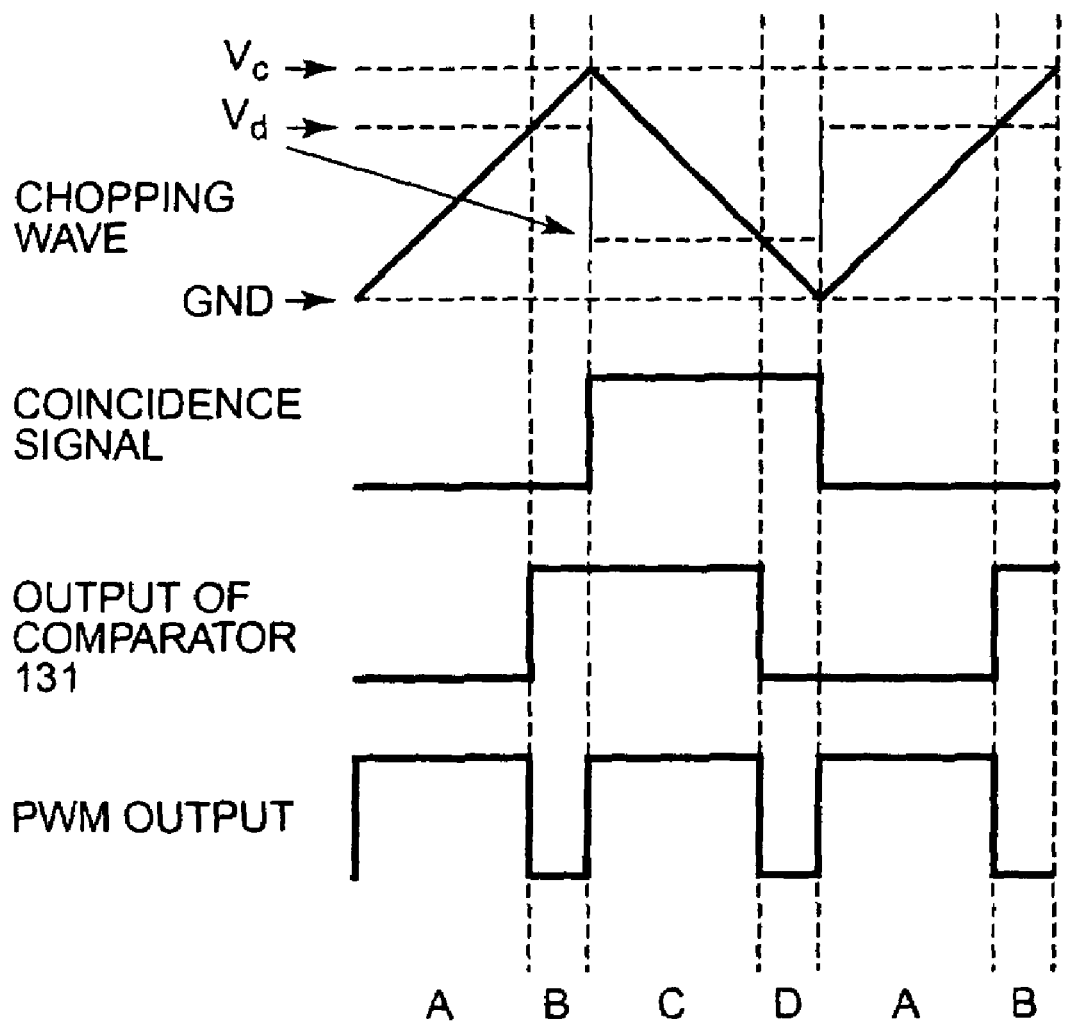

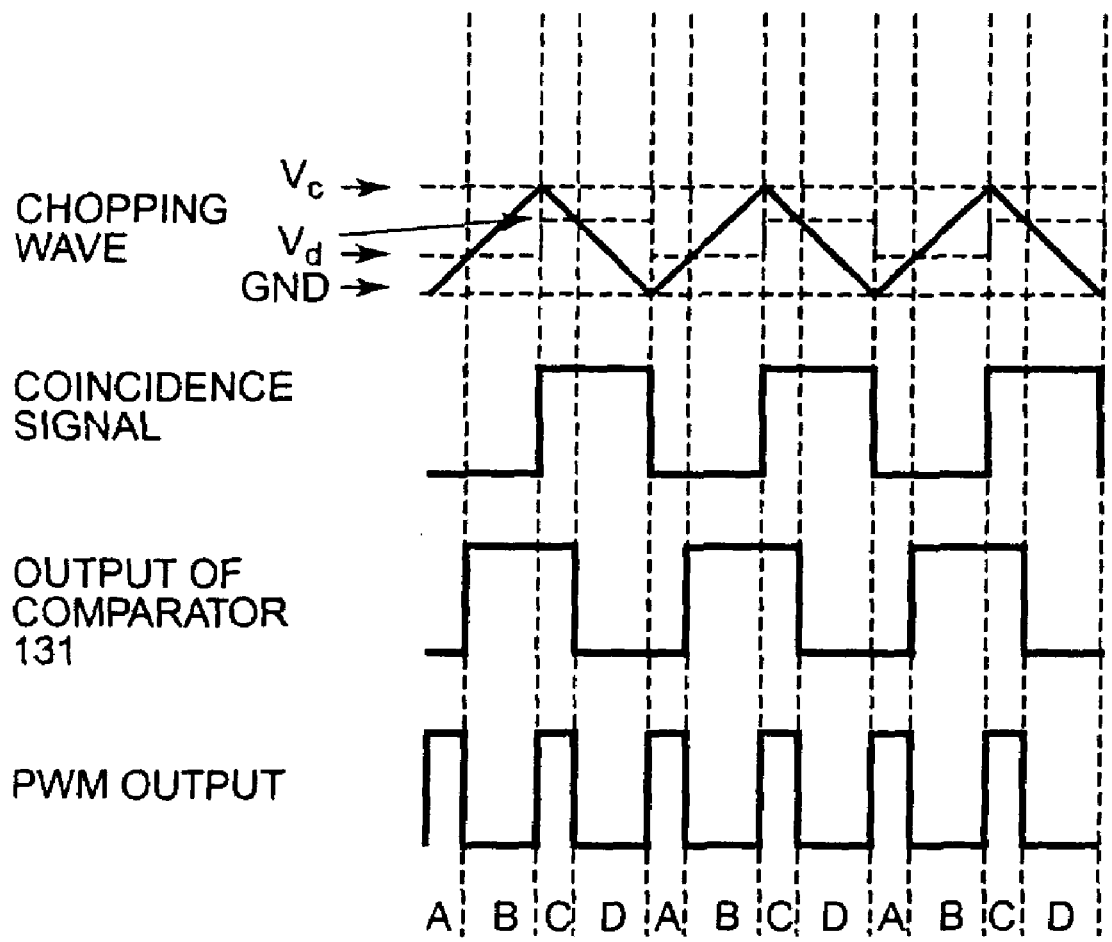

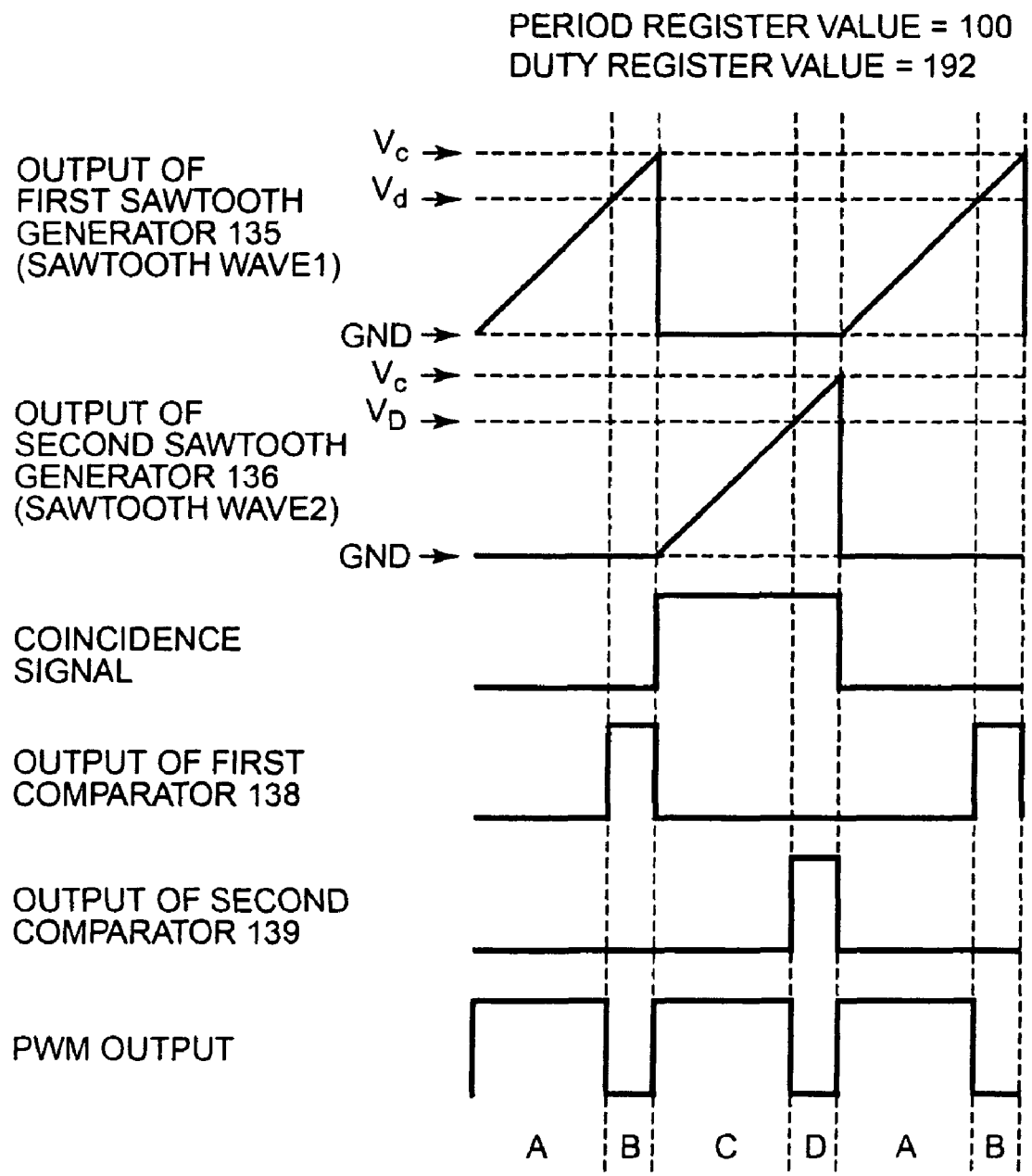

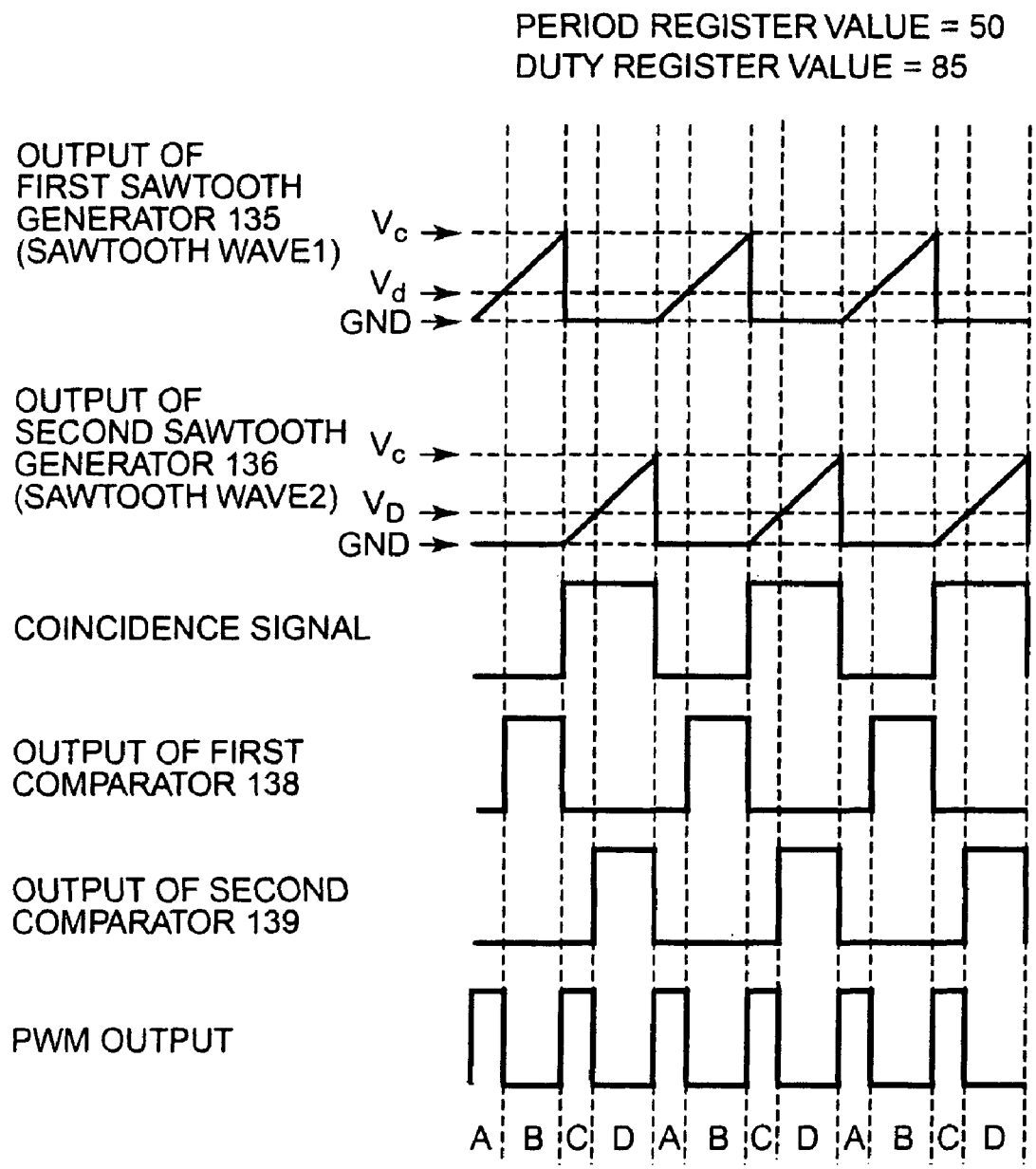

PULSE SIGNAL GENERATOR, AND METHOD OF GENERATING PULSE SIGNAL

INCORPORATION BY REFERENCE

This application is based upon and claims the benefit of priority from Japanese Patent Application No. 2008-216255 which was filed on Aug. 26, 2008, the disclosure of which is incorporated herein in its entirety by reference.

BACKGROUND OF THE INVENTION

1. Field of the Invention

The present invention relates to a pulse signal generator, and to a method of generating a pulse signal.

2. Description of Related Art

In recent years, with an aim to perform dimming control of illumination or liquid crystal backlight, a pulse width modulation (PWM) signal is frequently used. When a pulse signal is used for the above intended purpose, it is necessary to change a period of the pulse signal according to a resonance frequency of an inverter, a refresh rate of a screen, or the like. In this case, even when the period of the pulse signal is changed, it is necessary to retain the duty ratio and the number of steps. On the other hand, with the higher function of products, a demand is made to reduce a load on a central processing unit (CPU). For that reason, a pulse generating device is demanded which is capable of retaining the duty ratio and the number of steps without exerting a load on the CPU when the period of the pulse signal is changed.

An example of the solution has been proposed in JP-A-2002-141787. FIG. 13 shows a block diagram for explaining a pulse generator circuit disclosed in JP-A-2002-141787. The pulse generator circuit shown in FIG. 13 is made up of counter circuits 1, 2, and an RS flip-flop circuit 3. The counter 1 and the counter 2 are controlled by a CPU (not illustrated).

In the disclosure of JP-A-2002-141787, when the counter 1 is selected by the CPU, the counter 1 is set with (a pulse off time (t1))/(a reference clock period) as a count target set value. Likewise, when the counter 2 is selected by the CPU, the counter 2 is set with (a pulse period (t1+t2))/(a reference clock period) as the count target set value. The pulse off time means a period of time during which the pulse signal outputs a low level per cycle.

Also, the count operation of the counters 1 and 2 is executed on the basis of a reference clock. The count operation of each counter starts when a START signal input to an input terminal ST of each counter is rendered active.

FIG. 14 shows a timing chart of the pulse generator circuit disclosed in JP-A-2002-141787. An upper diagram of FIG. 14 shows a timing chart in which the axis of ordinate is a counter value whereas the axis of abscissa is a time value. A lower diagram of FIG. 14 shows a signal change of an output signal OUT on the same time axis as that of the upper diagram. First, an initial state of the output signal of the RS flip-flop 3 is set to the low level. In the counter 1, when a value counted by the reference clock reaches the count target set value, a count complete signal is outputted from an output terminal O1 of the counter 1. The signal output from the counter 1 is inputted to an input terminal S of the RS flip-flop 3. As a result, the output signal of the RS flip-flop 3 changes over from the low level to a high level.

Likewise, in the counter 2, when the value counted by the reference clock reaches the count target set value, the count complete signal is outputted from an output terminal O2 of the counter 2. The signal output from the counter 2 is inputted to an input terminal R of the RS flip-flop 3. As a result, the output signal of the RS flip-flop 3 changes over from the high level to the low level.

As described above, a pulse having the duty ratio and the frequency in an arbitrary pulse off time can be generated according to (the set value of the counter 1)/(the set value of the counter 2). In this case, the period and frequency of the pulse are determined by the counter 2. Also, the duty ratio in the off time of the pulse output signal is determined according to the set value of the counter 1 and the set value of the counter 2.

Further, JP-A-HEI5-260798 discloses a circuit configuration which is capable of changing only the duty ratio of the pulse signal. FIG. 15 shows a block diagram of a torque control circuit for a stepping motor disclosed in Patent Document 2. The block diagram shown in FIG. 15 is made up of a sawtooth generator circuit 501, a digital-to-analog (D/A) converter 505, a comparator 502, a driver 503, and a stepping motor 504. In this case, only parts related to the art of the present invention in the block diagram shown in FIG. 15 will be described.

In the block diagram shown in FIG. 15, a sawtooth wave having a given period output from the sawtooth generator circuit 501 is inputted to a noninverting input terminal of the comparator 502. Also, a control signal output from the D/A converter 505 is inputted to an inverting input terminal of the comparator 502.

In this case, when a voltage level of the noninverting input signal is larger than a voltage level of the inverting input signal, a signal of high level is outputted from the comparator 502. Also, when the voltage level of the noninverting input signal is smaller than the voltage level of the inverting input signal, a signal of low level is outputted from the comparator 502. That is, the voltage level of the control signal output from the D/A converter 505 is controlled, thereby enabling only the duty ratio of the pulse signal output from the comparator 502 to be changed.

SUMMARY

However, the present inventor has recognized the following point. Namely, in the pulse generator circuit disclosed in JP-A-2002-141787, because the duty ratio of the pulse off time is determined according to (the set value of the counter 1)/(the set value of the counter 2), there arises such a problem that when the period of the pulse signal, that is, the set value of the counter 2 is changed, the duty ratio is also changed. In JP-A-2002-141787, with an aim to change the period of the pulse signal while retaining the duty ratio, processing of finding the duty ratio through arithmetic operation, processing of looking up a corresponding value in a table, or the like is required. For that reason, for example, there arises such a problem that a load is exerted on the CPU by execution of the program.

On the other hand, in JP-A-HEI5-260798, when the period of the pulse signal is changed, that is, when the period of the signal output from the sawtooth generator circuit 501 is changed, a maximum output voltage value of the sawtooth wave also changes. For that reason, the duty ratio of the pulse signal output from the comparator 502 is caused to change with the result that there arises the same exemplary problem as that with JP-A-2002-141787.

As described above, in the circuits disclosed in JP-A-2002-141787 and JP-A-HEI5-260798, there arises an exemplary problem that the duty ratio changes when the period of the pulse signal is changed. Also, there arises an exemplary problem that a load is exerted on the CPU when the period is going to be changed while retaining the duty ratio of the pulse signal.

The present invention seeks to solve one or more of the above problems, or to improve upon those problems at least in part.

In one exemplary embodiment, a pulse signal generator includes a period setting unit that receives a period set signal including an information indicative of a pulse period, and that outputs a period control signal controlling the pulse period, a duty ratio setting unit that receives a duty ratio set signal including an information indicative of a duty ratio of a pulse, that receives a signal including the pulse period set in the period setting unit, and that generates a duty ratio control signal controlling the duty ratio of the pulse on a basis of the pulse period and the duty ratio set signal, and a pulse generation unit that generates a pulse signal including the pulse period and the duty ratio of the pulse on a basis of the period control signal and the duty ratio control signal.

In another exemplary embodiment, a pulse signal generator includes a period control unit which compares a count value with a period set value to generate a coincidence signal, a duty ratio control unit which generates a first potential corresponding to the period set value, and which divides the first potential on a basis of a duty set value to generate a second potential, and an output unit which includes an integrator which receives the coincidence signal, and which compares an output signal from the integrator with the second potential to generate a pulse signal.

In yet another exemplary embodiment, a method of generating a pulse signal includes counting a clock signal to generate a count value, comparing the count value with a period set value to generate a coincidence signal, generating a first potential corresponding to the period set value, dividing the first potential on a basis of a duty set value to generate a second potential, integrating the coincidence signal to generate a signal of an integral wave, and comparing the signal of the integral wave with the second potential to generate the pulse signal.

With the above-described features, it is possible to realize that the duty ratio of the pulse signal is always "(the duty set value set in a duty register)/(the maximum set value of the duty register)". Accordingly, the duty set value set in the duty register is adjusted, thereby enabling the duty ratio of the pulse signal to be determined without being affected by the period of the pulse signal. Also, the above operation can be executed without exerting a load on the CPU.

The present invention is capable of setting the period and the duty ratio of the pulse signal without affecting each other, uniquely.

BRIEF DESCRIPTION OF THE DRAWINGS

The above and other purposes, advantages and features of the present invention will become more apparent from the following description of certain exemplary embodiments taken in conjunction with the accompanying drawings in which:

FIG. 9A is a diagram showing a timing chart according to the first exemplary embodiment of the present invention;

FIG. 9B is another diagram showing a timing chart according to the first exemplary embodiment of the present invention;

FIG. 9C is yet another diagram showing a timing chart according to the first exemplary embodiment of the present invention;

FIG. 10A is a diagram showing a timing chart according to the second exemplary embodiment of the present invention;

FIG. 10C is yet another diagram showing a timing chart according to the second exemplary embodiment of the present invention;

FIG. 11A is a diagram showing a timing chart according to the third exemplary embodiment of the present invention;

FIG. 11C is yet another diagram showing a timing chart according to the third exemplary embodiment of the present invention;

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention, and that the invention is not limited to the exemplary embodiments illustrated for explanatory purposes.

First Exemplary Embodiment

Figure 1:
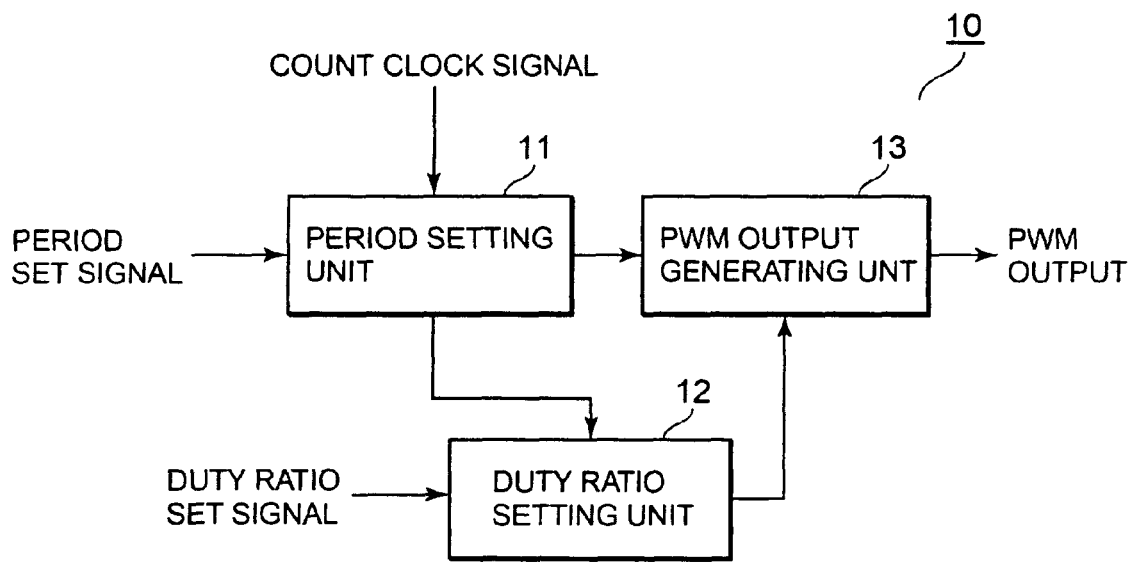
FIG. 1 is a schematic diagram of a PWM output generating device according to a first exemplary embodiment of the present invention.

FIG. 1 shows a schematic diagram of a PWM output generating device 10 being a pulse signal generator according to a first exemplary embodiment. The PWM output generating device 10 is made up of a period setting unit 11, a duty ratio setting unit 12, and a PWM output generating unit (a pulse generation unit) 13. The period setting unit 11 mainly has a function of setting a period of a pulse signal. The duty ratio setting unit 12 mainly has a function of setting a duty ratio of the-pulse signal. The PWM output generating unit 13 mainly functions as a pulse generation unit that generates and outputs the pulse signal on the basis of the set period and the set duty ratio.

The period setting unit 11 enters a period set signal for setting the period of the pulse signal and a count clock signal, outputs a period control signal to the PWM output generating unit 13, and outputs a period set value to the duty ratio setting unit 12. Also, the duty ratio setting unit 12 enters a duty ratio set signal and the period set value output from the period setting unit 11, and outputs a duty ratio control signal. The PWM output generating unit 13 enters the period control signal output from the period setting unit 11 and the duty ratio control signal output from the duty ratio setting unit 12, and outputs the pulse signal. The pulse signal output from the PWM output generating unit 13 is outputted in synchronism with the count clock signal.

In this way, in the PWM output generating device 10 shown in FIG. 1, not only the duty ratio set signal but also the period set value output from the period setting unit 11 are inputted to the duty ratio setting unit 12. The duty ratio setting unit 12 generates the duty ratio control signal according to the pulse period specified by the period set value output from the period setting unit 11 so that the pulse signal having the duty ratio corresponding to the duty ratio set signal is finally output from the PWM output generating unit 13, and outputs the duty ratio control signal to the PWM output generating unit 13. This enables the pulse period and the duty ratio to be controlled at the same time.

Figure 2:
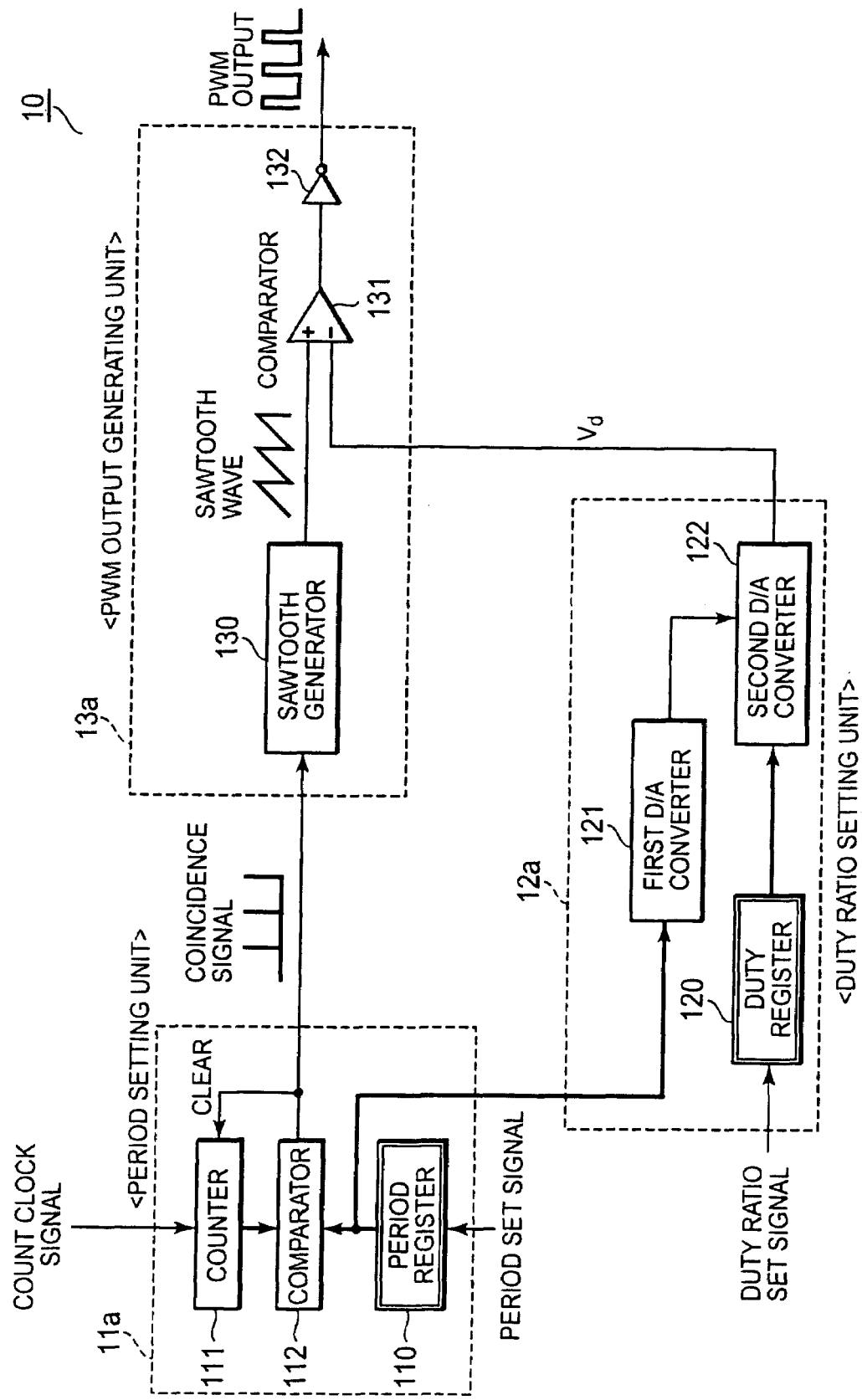
FIG. 2 is a detailed diagram of the PWM output generating device according to the first exemplary embodiment of the present invention.

Subsequently, a description will be given in detail of the PWM output generating device 10 according to the first exemplary embodiment of the present invention with reference to FIG. 2. The PWM output generating device 10 shown in FIG. 2 is made up of period setting unit 11a, duty ratio setting unit 12a, and PWM output generating unit 13a, as shown in the schematic diagram of FIG. 1.

The period setting unit 11a is made up of a period register 110, a comparator 112, and a counter 111. To the period register 110 is inputted the period set signal for setting the frequency of the pulse signal. From the period register 110 is outputted a signal set on the basis of the period set signal as the period set value. On the other hand, to the counter 111 is inputted the count clock signal. From the counter 111 is outputted a signal output according to the counter clock signal as a count value.

To the comparator 112 are inputted the signal (count value) output from the counter 111 and the signal (period set value) output from the period register 110. The count value is compared with the period set value by the comparator 112. When the count value reaches the period set value, a coincidence signal (pulse) is outputted from the comparator 112. The coincidence signal is inputted to the counter 111 as a reset signal, and also input to the PWM output generating unit 13a as the period control signal. Because the coincidence signal is inputted to the counter 111 as the reset signal, the count value of the counter 111 is reset every time the coincidence signal is outputted. In this way, the coincidence signal having a given period is outputted from the comparator 112.

The duty ratio setting unit 12a is made up of a duty register 120, and a first D/A converter 121 and a second D/A converter 122 which are of a two-stage structure according to an exemplary configuration of the present invention. To the duty register 120 is inputted the duty ratio set signal for setting the duty ratio of the pulse signal. From the duty register 120 is outputted the signal set on the basis of the duty ratio set signal as the duty set value.

The period set value output from the period register 110 of the period setting unit 11a is inputted to the first D/A converter 121. Also, the duty set value output from the duty register 120 is inputted to the second D/A converter 122. Further, a signal output from the first D/A converter 121 is inputted to a power supply terminal at a higher potential side of the second D/A converter 122.

Figure 7:
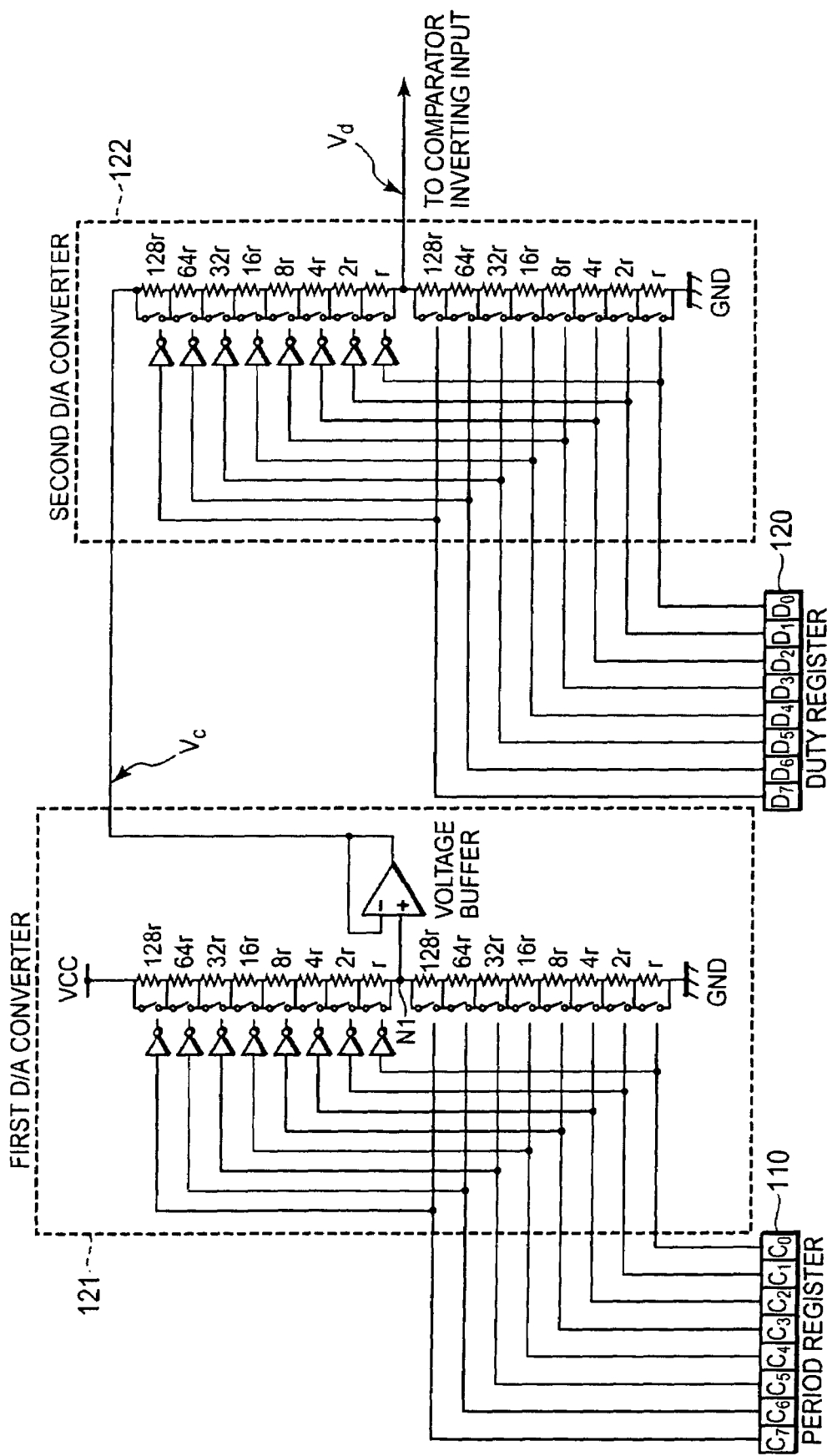
FIG. 7 is a diagram showing a configuration example of duty ratio setting unit 12a of FIG. 1 according to the present invention.

An example of the circuit configuration of the first D/A converter 121 and the second D/A converter 122 being of the two-stage structure is shown in FIG. 7. The circuit of FIG. 7 exemplifies a case in which the period register 110 and the duty register 120 are structured by 8 bits, respectively. The period set value output from the period register 110 of the period setting unit 11a is inputted to the first D/A converter 121.

In the example of FIG. 7, the first D/A converter 121 has a power supply terminal at the higher potential side connected with a supply voltage terminal VCC, and a power supply terminal at the lower potential side connected with a ground voltage terminal GND. The power supply terminal at the higher potential side and the power supply terminal at the lower potential side are connected to a node N1. Resistive elements corresponding to the bit width of the period register 110 are connected in series between the power supply terminal at the higher potential side and the node N1, and between the power supply terminal at the lower potential side and the node N1. In the example of FIG. 7, because the bit width of the period register 110 is structured by 8 bits, eight resistive elements are connected in series, respectively.

Also, each resistive element has a switch for short-circuiting both ends of the resistive element. The switch is controlled according to the signal output from the period register 110. In the example of FIG. 7, each switch turns on when a control signal for the switch is at a low level, and both ends of the corresponding resistive element is short-circuited. A signal output from each register in the period register 110 controls, at the same time, two switches including a switch corresponding to the resistive element connected between the power supply terminal at the higher potential side and the node N1, and a switch corresponding to the resistive element connected between the power supply terminal at the lower potential side and the node N1, but transmits signal values of voltage levels different from each other to the respective switches.

Also, the resistance value of each resistive element is set such that, with the resistive element corresponding to a signal of the least significant bit of the period register 110 as a base unit, the resistance value by a factorial of 2 is set in each resistive element in order from the lower significant bit. The node N1 is connected to a noninverting input terminal of a voltage buffer (amplifier). An output terminal of the voltage buffer is connected to an inverting input terminal of its own voltage buffer, and the power supply terminal at the higher potential side of the second D/A converter 122. With the above circuit configuration, the first D/A converter 121 outputs a signal of a voltage level Vc corresponding to the period set value set in the period register 110.

The circuit configuration of the second D/A converter 122 is identical with the first D/A converter 121. The duty set value output from the duty register 120 is inputted to the second D/A converter 122. As with the first D/A converter 121, the signal of the voltage level Vd corresponding to the duty set value is outputted.

To the power supply terminal at the higher potential side of the second D/A converter 122 is inputted the signal output from the first D/A converter 121. For that reason, the maximum voltage level of the signal output from the second D/A converter 122 is Vc. The voltage Vc is divided by "(the duty set value)/(the maximum set value of the duty register 120)", and output from the second D/A converter 122 as a voltage Vd to the inverting terminal 1 of the comparator 112. Accordingly, the voltage Vd can be expressed by "Vd=Vc×(duty set value)/(maximum set value of duty register 120)".

In this way, the voltage Vd of the signal output from the duty ratio setting unit 12a having the D/A converters 121, 122 having the two-stage structure becomes a value reflecting the voltage Vc that is in proportion to the period set value set in the period register 110.

The PWM output generating unit 13a is made up of a sawtooth generator (integrator) 130, a comparator 131, and an inverter 132. To the sawtooth generator 130 is inputted a coincidence signal output from the period setting unit 11a. Then, from an output terminal of the sawtooth generator (integrator) 130 is outputted a signal of an integral waveform. In this case, since the integral waveform is linear, the maximum voltage of the signal output from the sawtooth generator 130 is in proportion to the period of the coincidence signal, that is, the period set value set in the period register 110. Also, the output voltage Vc of the first D/A converter 121 is in proportion to the period set value set in the period register 110. Accordingly, the maximum voltage of the output of the sawtooth generator 130 and the output voltage Vc of the first D/A converter 121 can be changed according to a variation in the period set value at the same time.

Figure 5:
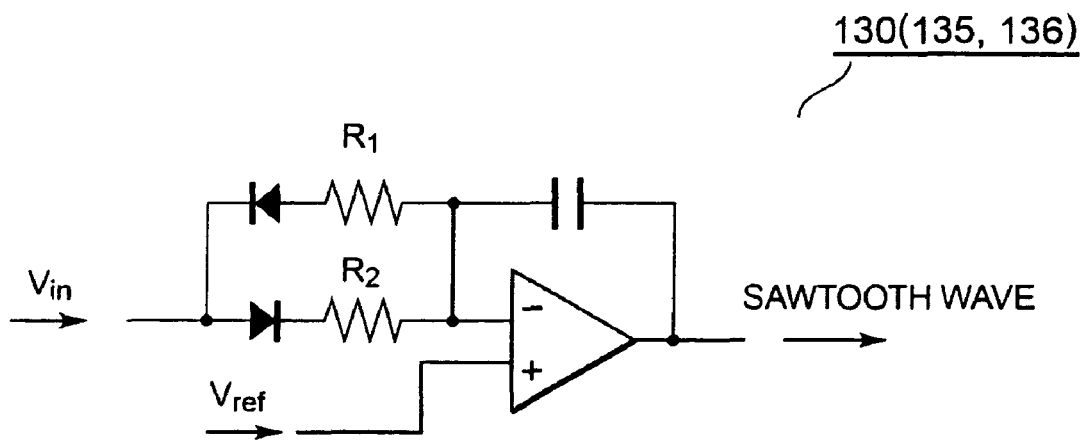
FIG. 5 is a diagram showing a configuration example of sawtooth wave generators 130, 135, and 136 according to the present invention.

Now, a specific circuit example of the sawtooth generator 130 is shown in FIG. 5. With a setting of R1>>R2, and Vin (minimum value)<Vref<Vin (maximum value), before the coincidence signal occurs (Vin=low level), a current flows in a resistor R1 to increase the voltage, and a current flows in a resistor R2 by a short active width (Vin=high level) of the coincidence signal to steeply decrease the voltage, thereby enabling the sawtooth wave to be generated.

To a noninverting input terminal of the comparator 131 is inputted the sawtooth wave generated from the sawtooth generator 130, and to the inverting input terminal is inputted an analog voltage Vd from the duty ratio setting unit 12a. In the first exemplary embodiment, the maximum voltage of the signal output from the sawtooth generator 130, and the voltage Vc of the signal output from the first D/A converter 121 are adjusted to the same voltage level value.

In this example, the maximum voltage of the sawtooth wave is expressed by Vc, and the analog voltage Vd is expressed by "Vd=Vc×(set value of duty register 120)/(maximum set value of duty register 120)". Accordingly, from an output terminal of the comparator 131 is outputted the PWM waveform of the duty ratio set in the duty register 120.

In this case, the output of the comparator 131 is logically inverted by the inverter 132, thereby allowing the duty ratio of the high level to be made in proportion to the set value of the duty register 120 (example of FIG. 2). When the signal output from the comparator 131 is not logically inverted, the duty ratio of the low level can be made in proportion to the set value of the duty register 120.

FIGS. 9A to 9C show timing charts of the first exemplary embodiment. Now, an example in which the duty register 120 is structured by 8 bits (set value=0 to 255) will be described with reference to specific numeric values.

FIG. 9A shows a timing chart in the case of a duty register value=192, that is, the duty ratio=192/255×100≈75%. In this case, Vd=Vc×0.75 is satisfied.

First, in the sawtooth wave, before the coincidence signal occurs, the voltage of the sawtooth wave increases due to the low level of the coincidence signal, and when the coincidence signal occurs, the voltage of the sawtooth wave steeply decreases due to the high level of the coincidence signal. As a result, the sawtooth wave being in synchronism with the coincidence signal is generated.

Then, in the output of the comparator 131, the output of the low level is made when sawtooth wave<Vd, and the output of the high level is made when sawtooth wave>Vd. Accordingly, a ratio of the low level time of the signal output from the comparator 131 to one period of the pulse is equal to a ratio of Vd to Vc, that is, the duty ratio, and, in this case, 75%.

The signal output from the comparator 131 is logically inverted, thereby outputting the PWM waveform with the duty ratio of the high level being 75%.

FIG. 9B shows a timing chart in the case where the period register value is equivalent to that of FIG. 9A, and the duty register value is changed to 85, that is, in the case of the duty ratio=85/255×100≈33%. In this case, because of Vd=Vc× 0.33, the PWM waveform with the duty ratio of the high level being 33% is outputted due to the same principle as that of FIG. 9A.

FIG. 9C shows a timing chart in the case where the period register value is set to ½. In this case, FIGS. 9B and 9C are equivalent in the duty set value set in the duty register to each other. In this event, the period register value is set to ½ with the result that the output voltage Vc of the first D/A comparator 121 becomes ½. At the same time, the period of the coincidence signal is set to ½ whereby the maximum voltage of the sawtooth wave also becomes ½. Accordingly, it is possible to make the maximum voltage of the sawtooth wave always equal to the output voltage Vc of the first D/A comparator 121. Further, the value of Vd can be always set to a value obtained by dividing Vc (maximum voltage of the sawtooth wave) by the duty ratio. Accordingly, even if the period register value is changed as shown in FIG. 9C, it is possible to output the PWM signal with the duty ratio of the high level being 33% as in FIG. 9B.

A mechanism that is capable of solving the problem with the related art according to the present invention will be described. First, both of the output voltage Vc of the first D/A comparator 121 and the maximum voltage of the sawtooth generator 130 are in proportion to the set value of the period register 110. As a result, (output voltage Vc of the first D/A comparator 121)=(maximum voltage of the sawtooth generator 130) can be established.

Then, the output voltage Vd of the second D/A comparator 122 is obtained by dividing the output voltage Vc of the first D/A comparator 121 by "(set value of the duty register 120)/ (maximum set value of the duty register 120)". As a result, regardless of the set value of the period register 110, the output voltage Vd of the second D/A comparator 122 is capable of realizing "Vd=Vc×(set value of the duty register 120)/(maximum set value of the duty register 120)".

Further, the above-mentioned sawtooth wave (maximum voltage Vc) and the output voltage Vd of the second D/A comparator 122 are inputted to the noninverting input terminal and the inverting input terminal of the comparator 131, respectively. As a result, the PWM output with "(set value of the duty register 120)/(maximum set value of the duty register 120)" being the duty ratio can be generated from the output of the comparator 131. In this case, since the duty ratio does not depend on the set value of the period register 110, even if the set value of the period register 110 is changed, the duty ratio of the PWM output can be retained without any change in the set value of the duty register 120.

Also, the related art suffers from not only a problem that the number of steps of the settable duty ratio is changed when the period is changed, but also another problem that the same duty ratio cannot be always resultantly retained. However, in the present invention, because the number of steps is always the maximum set value of the duty register, there is an advantage in that the number of steps of the settable duty ratio is held constant without depending on the period, and the entirely same duty ratio can be retained.

Second Exemplary Embodiment

With an aim to realize the duty ratio high in precision in a first exemplary embodiment of the present invention, an ideal sawtooth wave is necessary, and to achieve this, a coincidence signal having the active width close to 0 seconds (i.e., instantaneously) without limit, and a sawtooth wave that takes 0 seconds (i.e., instantaneously) to arrive at the minimum voltage from the maximum voltage are optimum. However, it is difficult to realize the above in an actual device, and a precision in the duty ratio of the PWM output becomes lower as the active width of the coincidence signal is larger, and as the voltage drop time of the sawtooth wave is longer.

Figure 3:
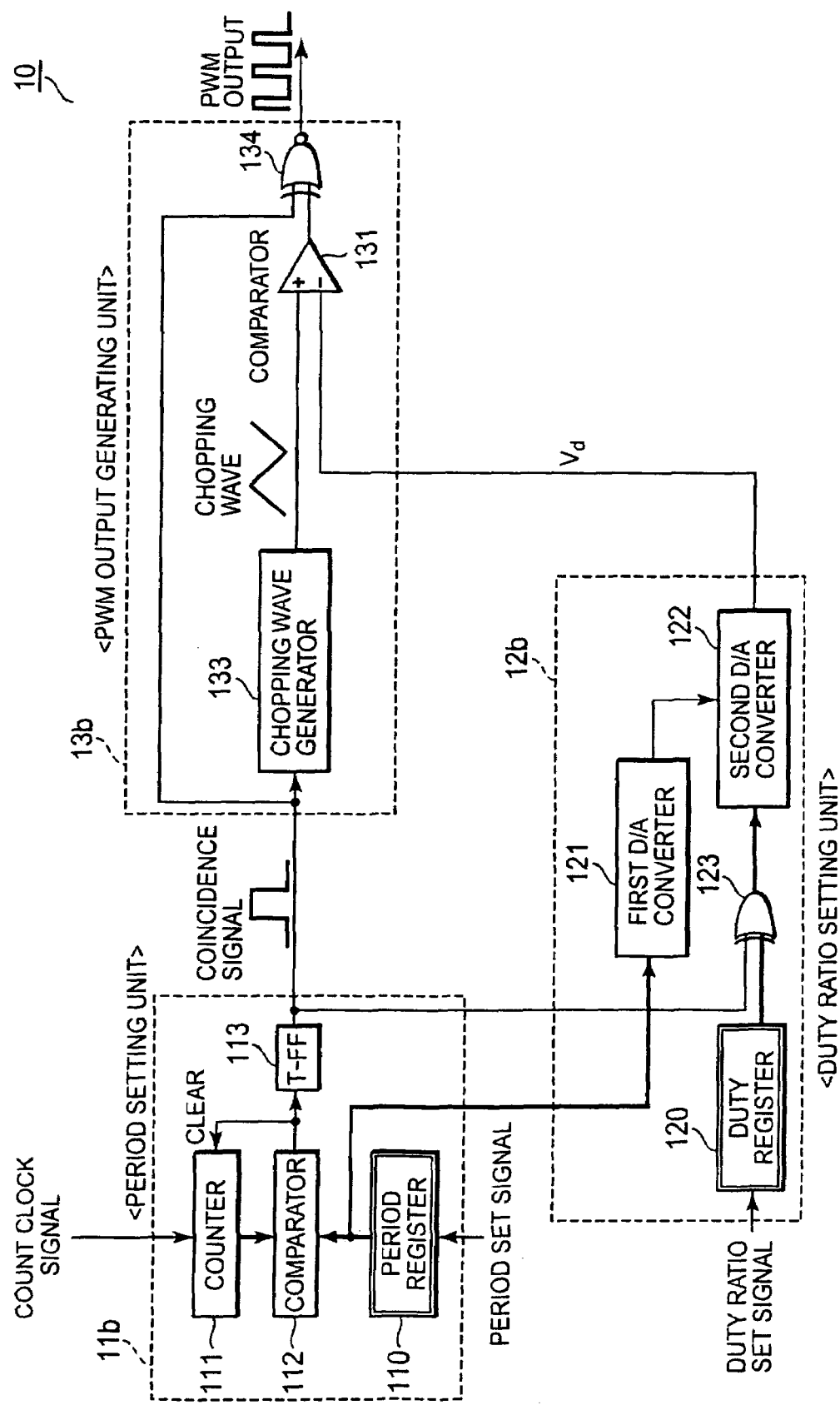
FIG. 3 is a diagram of a PWM output generating device according to a second exemplary embodiment of the present invention.

In order to solve the above problem, in the second exemplary embodiment of the present invention, as shown in FIG. 3, the sawtooth wave is changed to a chopping wave. As a result, it is unnecessary that an integrator output (output of the sawtooth generator 130 in the first exemplary embodiment) performs a voltage drop in 0 seconds (i.e., instantaneously), and a rising edge and a falling edge are dealt with as the coincidence signal, thereby requiring no coincidence signal whose active width is close to 0 without limit. Accordingly, there can be solved the problem with the first exemplary embodiment that the precision in the duty ratio of the PWM output is deteriorated by the above factors.

FIG. 3 shows the configuration of a PWM output generating device 10 according to the second exemplary embodiment. In the second exemplary embodiment, the same structural parts as those in the first exemplary embodiment of the present invention are denoted by identical references, and their description will be omitted.

Period setting unit 11$b$ has a T-FF (toggle flip-flop) 113 in addition to the configuration of the first exemplary embodiment. To the T-FF is inputted a signal output from the comparator 112 whereby an output level of the T-FF 113 is inverted every time the comparator 112 detects the coincidence. As a result, the period setting unit 11$b$ generates the coincidence signal that is logically inverted every time the comparator 112 detects the coincidence, unlike the first exemplary embodiment of the present invention.

Figure 8:
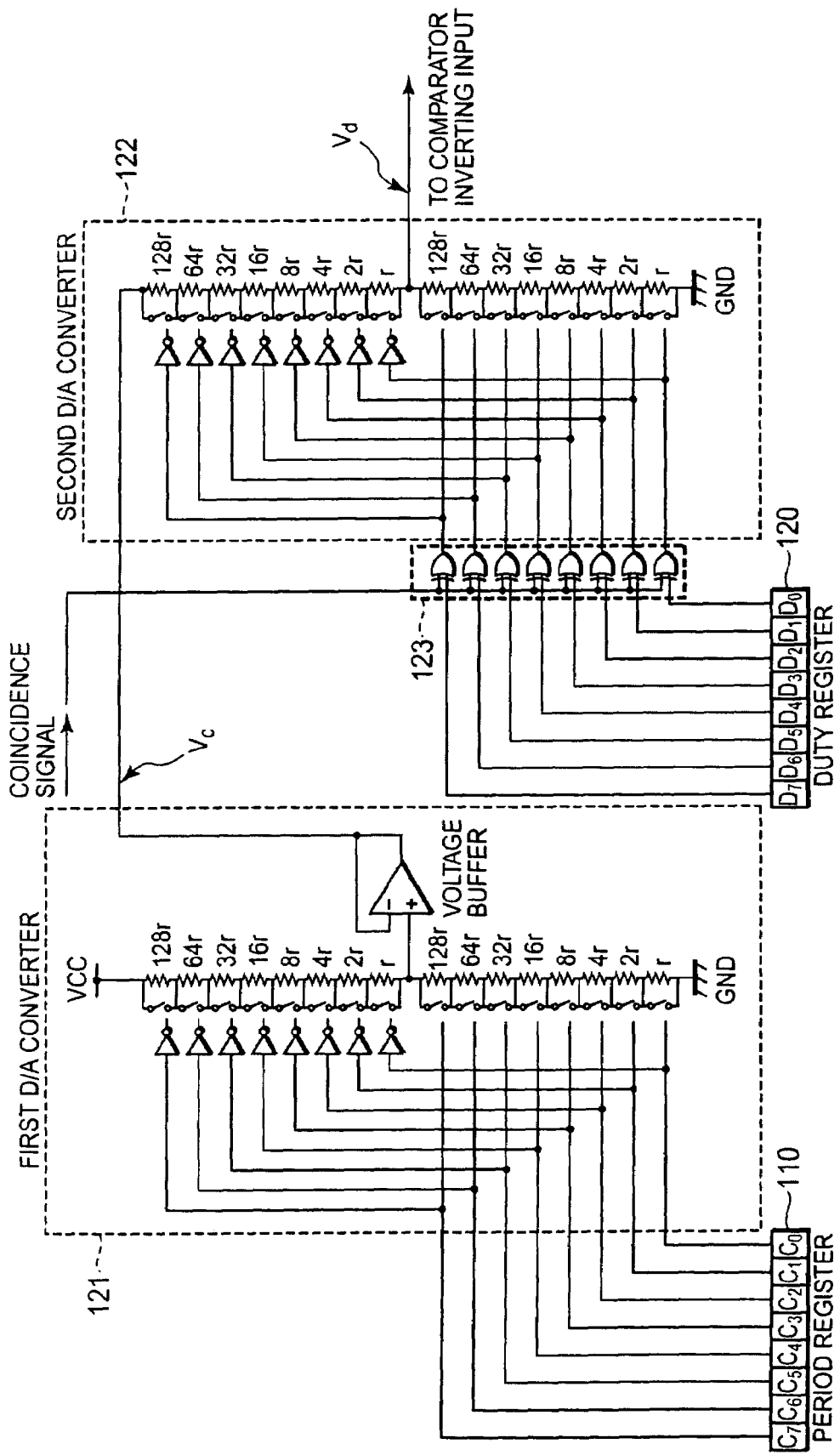
FIG. 8 is a diagram showing a configuration example of duty ratio setting unit 12b of FIG. 1 according to the present invention.

Duty ratio setting unit 12$b$ has an XOR gate 123 in addition to the configuration of the first exemplary embodiment of the present invention, and the output of the second D/A converter 122 changes depending on whether the coincidence signal is at the low level or the high level. A more detailed circuit configuration example is shown in FIG. 8. Input and output of the second D/A converter 122 are different from those in the first exemplary embodiment. Since the input to D/A converter 122 is determined according to an XOR (exclusive OR) (i.e., XOR gate 123) of the set value of the duty register 120 and the coincidence signal, the output changes every time the level of the coincidence signal is inverted. That is, when the coincidence signal is at the low level, "Vd=Vc×(set value of the duty register 120)/(maximum set value of the duty register 120)" is established as in the first exemplary embodiment. On the other hand, when the coincidence signal is at the high level, there is the feature that "Vd=Vc×{1−(set value of the duty register 120)/(maximum set value of the duty register 120)}" is established, and the voltage level of Vd is inversed centered on the voltage ½Vc.

PWM output generating unit 13$b$ has a chopping generator 133 as the integrator, and also has the comparator 131 and an XNOR gate 134. The PWM output generating unit 13$b$ outputs exclusive NOR of a signal output from the comparator 131 and the coincidence signal from the XNOR 134. A signal output from the XNOR gate 134 becomes a PWM output.

Figure 6:
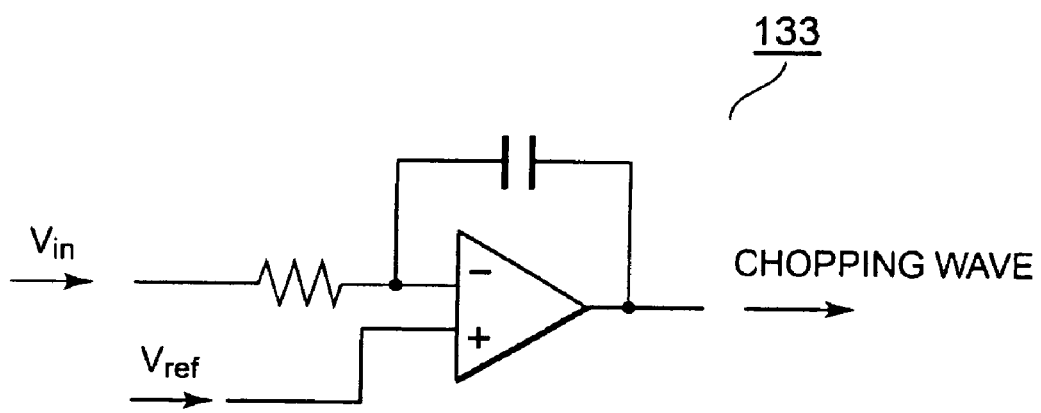
FIG. 6 is a diagram showing a configuration example of a chopping wave generator 133 according to the present invention.

Now, a specific circuit configuration example of the chopping wave generator 133 is shown in FIG. 6. With setting of Vin (minimum value)<Vref<Vin (maximum value), an output voltage of the chopping wave generator 133 increases when the coincidence signal Vin is at the low level, and the output voltage of the chopping wave generator 133 decreases when the coincidence signal Vin is at the high level. In this example, there is the feature,that "Vd=Vc×(set value of the duty register 120)/(maximum set value of the duty register 120)" is established when the voltage of the chopping wave increases, and "Vd=Vc×{1−(set value of the duty register 120)/(maximum set value of the duty register 120)}" is established when the voltage of the chopping wave decreases.

Then, the exclusive NOR of the output of the comparator 131 and the coincidence signal is outputted from the XNOR 134, thereby outputting a PWM waveform with the duty ratio of the high level being "(set value of the duty register 120)/(maximum set value of the duty register 120)". In this example, as in the first exemplary embodiment, when the exclusive NOR of the signal output from the comparator 131 and the coincidence signal is outputted from the XNOR 134 without conducting logical inversion at a final stage, the PWM waveform with the duty ratio of the low level being "(set value of the duty register 120)/(maximum set value of the duty register 120)" is outputted.

Figure 10B:
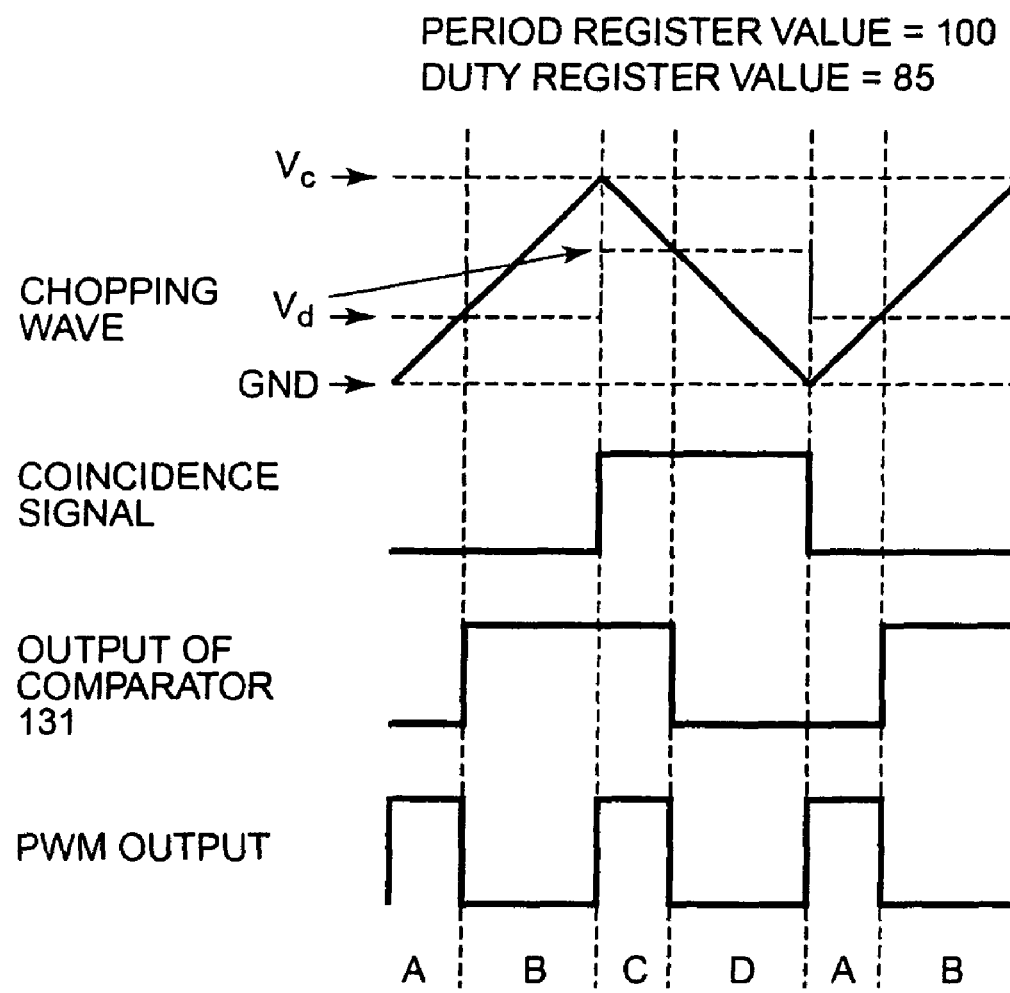
FIG. 10B is another diagram showing a timing chart according to the second exemplary embodiment of the present invention.

FIGS. 10A to 10C show timing charts according to the second exemplary embodiment. As in the first exemplary embodiment, a case in which the duty register 120 is structured by 8 bits (set value=0 to 255) will be described with reference to specific numeric values.

FIG. 10A shows a timing chart in the case of the duty register value=192, that is, in the case of the duty ratio=192/255×100≈75%. In this case, when the coincidence signal is at the low level, Vd=Vc×0.75 is established, and when the coincidence signal is at the high level, Vd=Vc×(1−0.75)=Vc×0.25 is established.

First, in the chopping wave, the voltage increases due to the low level of the coincidence signal, and the voltage decreases due to the high level of the coincidence signal. As a result, the chopping wave of one period is generated in two periods of the coincidence signal.

Then, in the output of the comparator 131, the low level output is conducted when the chopping wave<Vd, and the high level output is conducted when the chopping wave>Vd. In this example, Vd=Vc×0.75 is established when the chopping wave increases in voltage, and Vd=(1−0.75)=Vc×0.25 is established when the chopping wave decreases in voltage. Therefore, the output of the comparator 131 is inverted by 75% of one period in each case. Accordingly, the output of the comparator 131 is of a waveform in which the coincidence signal is delayed in phase by 75% of one period, and the level is inverted.

The PWM output with the duty ratio of the high level being 75% can be generated by XNORing the output of the comparator 131 and the coincidence signal. When not XNOR but XOR is applied, the PWM output with the duty ratio of the low level being 75% can be generated.

FIG. 10B shows a timing chart in the case where the period register value is equivalent to that in FIG. 10A, and the duty register value is changed to 85, that is, in the case of the duty ratio=85/255×100≈33%. In this case, due to the same principle as that in FIG. 10A, Vd=Vc×0.33 is established when the chopping wave increases in voltage, and Vd=Vc×(1−0.33)≈Vc×0.66 is established when the chopping wave decreases in voltage. Then, due to the same principle as that in FIG. 10A, the PWM waveform with the duty ratio of the high level being 33% is outputted.

FIG. 10C is a timing chart in the case where the duty register value is equivalent to that in FIG. 10B, and the period register value is set to ½. In this case, due to the same principle as that in the first exemplary embodiment, the PWM output with the duty ratio of the high level being 33% is realized even with a change in the period.

A mechanism that is capable of solving the problem with the related art according to the configuration of the second exemplary embodiment is identical with that in the first exemplary embodiment of the present invention.

The feature of the second exemplary embodiment resides in the configuration in which the chopping wave is used to change the period by inversion of the low level and the high level of the coincidence signal, and the coincidence signal whose active width is close to 0 without limit, which is a problem with the first exemplary embodiment, is not required. Also, a problem arising with a precision in the duty ratio of the PWM output being deteriorated when the sawtooth wave does not drop from the maximum voltage to the minimum voltage in 0 seconds does not occur due to the use of the chopping wave. Other features that the number of steps of the settable duty ratio is not changed even if the period is changed, and the entirely same duty ratio can be retained, are identical with those in the first exemplary embodiment of the present invention.

Third Exemplary Embodiment

The second exemplary embodiment of the present invention suffers from such a problem that the PWM output cannot change except only every two periods because the PWM output for two periods is conducted in one period of the chopping wave. This is because there is the possibility that, when a subsequent half period (one period of the PWM output) is changed in the chopping wave half period, the chopping wave does not return to an original voltage after half period, and with repetition of the change, the voltage value of the chopping wave reaches the upper limit or lower limit of outputable voltage, on the basis of the property that the voltage of the chopping wave returns to the original every one period.

Figure 4:
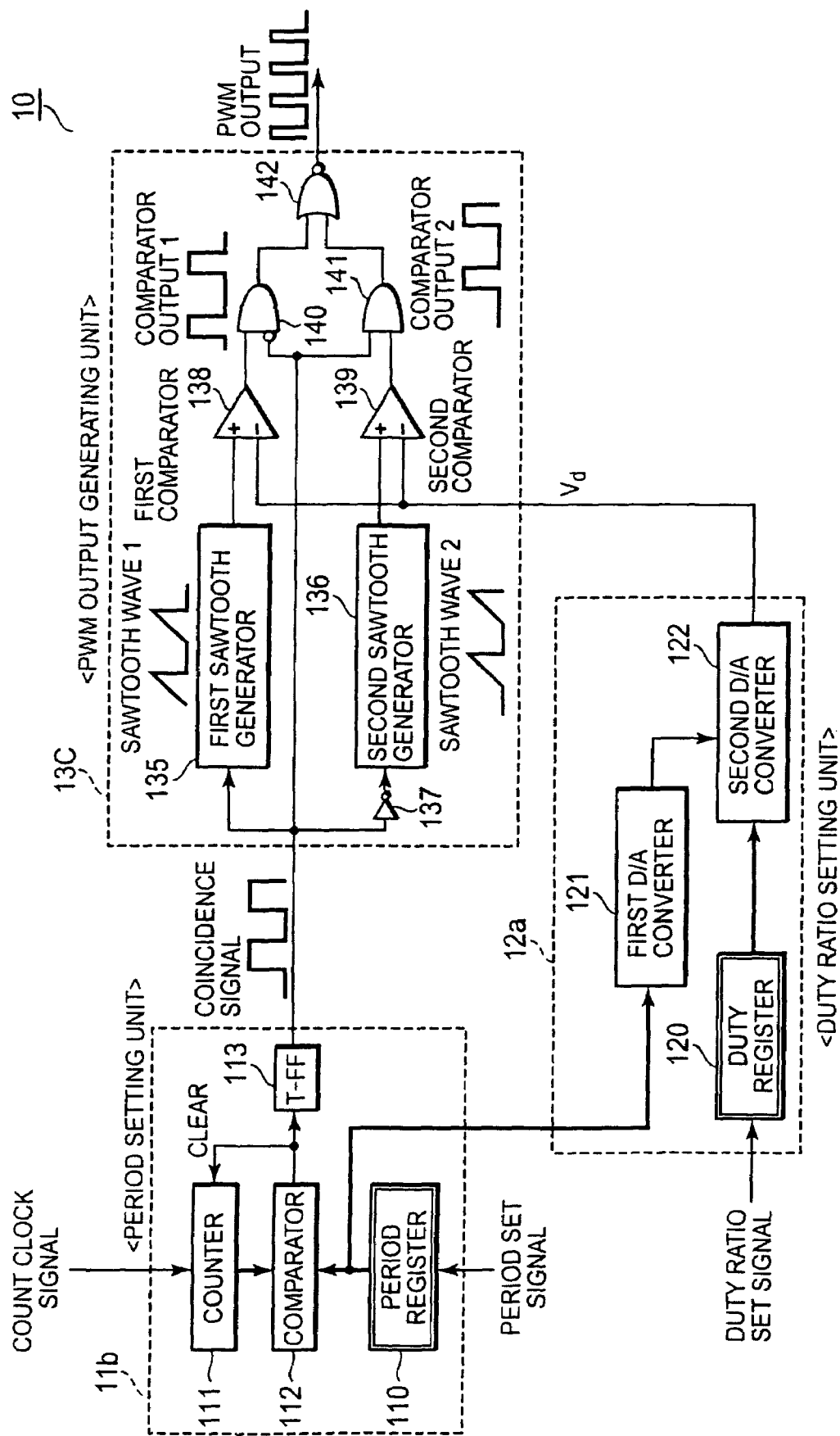
FIG. 4 is a diagram of a PWM output generating device according to a third exemplary embodiment of the present invention.

With an aim to solve the above problem, in a third exemplary embodiment, as shown in FIG. 4, the solution is realized by two integrators (sawtooth wave generators 135, 136) without using the chopping wave generator. Because the sawtooth wave alternately uses the voltage as boosted, the PWM output can be changed every one period. Also, there is the feature that the conditions in which the active width of the coincidence signal is 0 seconds (instantaneously), and the voltage drops in 0 seconds (instantaneously), which are problems with the first exemplary embodiment, are not required by this configuration. From the above viewpoint, the problems with the first and second exemplary embodiments can be solved.

FIG. 4 shows a PWM output generating device 10 according to the third exemplary embodiment. In the third exemplary embodiment of FIG. 4, the same structural parts as those in the first and second exemplary embodiments are denoted by identical references, and their description will be omitted.

The period setting unit 11b is identical in configuration with that in the second exemplary embodiment. The duty ratio setting unit 12a is identical in configuration with that in the first exemplary embodiment, and it is unnecessary to input the coincidence signal as in the second exemplary embodiment.

PWM output generating unit 13c includes two sawtooth generators (a first sawtooth generator 135 and a second sawtooth generator 136) as integrators, and two comparators (a first comparator 138 and a second comparator 139). The configuration example of the first sawtooth generator 135 and the second sawtooth generator 136 is shown in FIG. 5 as in the first exemplary embodiment.

A coincidence signal is inputted to the first sawtooth generator 135, and a coincidence signal that has been logically inverted by an inverter 137 is inputted to the second sawtooth generator 136. As a result, the sawtooth waves are alternately output from the first sawtooth generator 135 and the second sawtooth generator 136. The sawtooth waves are inputted to the first comparator 138 and the second comparator 139, respectively, whereby the PWM waveform with the duty ratio being "(set value of the duty register 120)/(maximum set value of the duty register 120)" is alternately output from the first comparator 138 and the second comparator 139, as in the first exemplary embodiment.

In this example, the logical AND of the output of the first comparator 138 and a signal obtained by logically inverting the coincidence signal is outputted from an AND gate 140 so that a precision in the duty ratio of the PWM output is not deteriorated when the sawtooth wave does not drop from the maximum voltage to the minimum voltage in 0 seconds (i.e., instantaneously). Also, the logical AND of the output of the second comparator 139 and the coincidence signal is outputted from an AND 141. Then, the negative OR of the output signal of the AND 140 and the output signal of the AND 141 is outputted from the NOR 142.

As a result, the PWM waveform with the duty ratio of the high level being "(set value of the duty register 120)/(maximum set value of the duty register 120)" is outputted. In this case, when the NOR 142 is replaced with OR (logical addition), the PWM waveform with the duty ratio of the low level being "(set value of the duty register 120)/(maximum set value of the duty register 120)" is outputted.

Figure 11B:
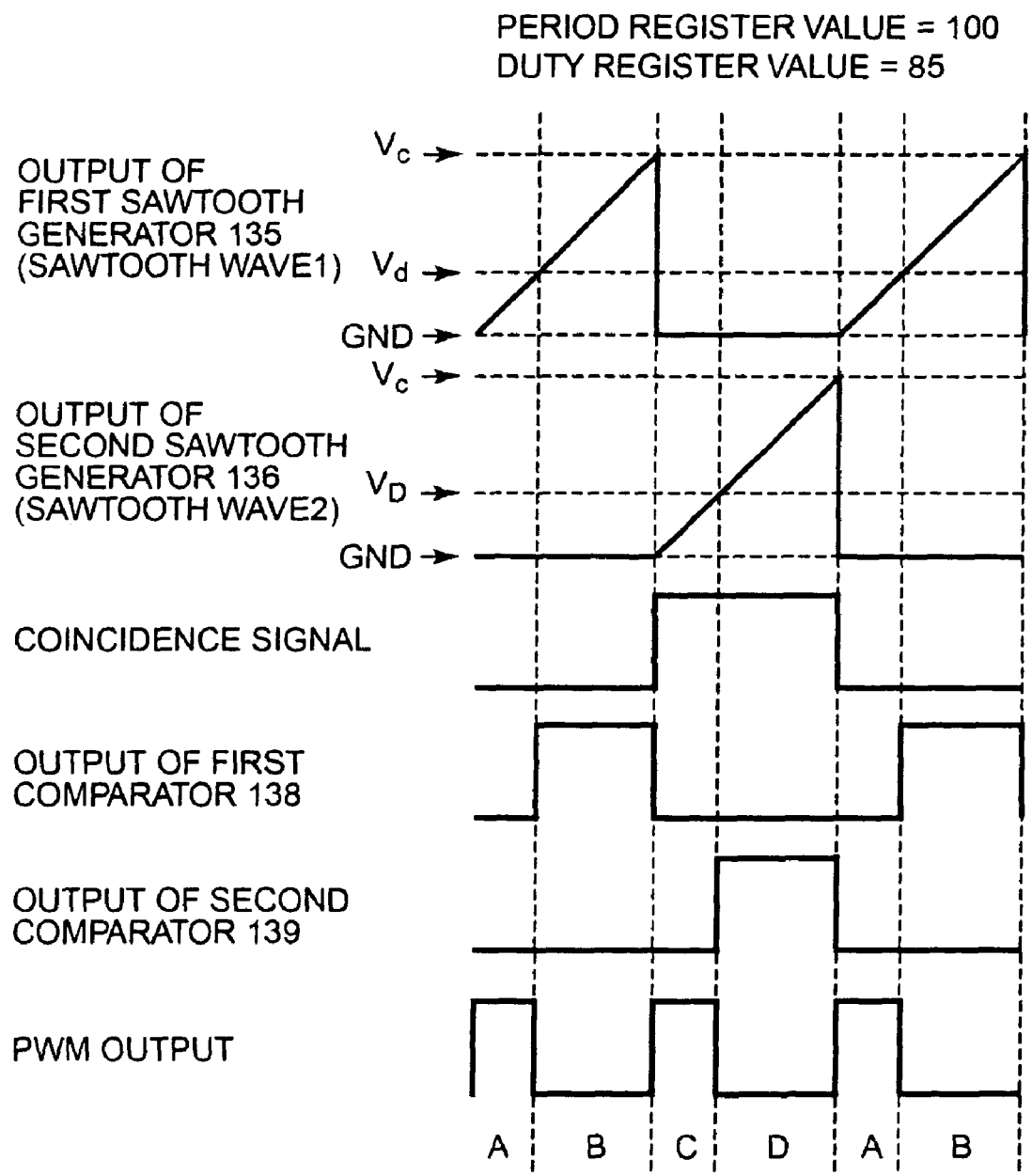
FIG. 11B is another diagram showing a timing chart according to the third exemplary embodiment of the present invention.

FIGS. 11A to 11C show timing charts according to the third exemplary embodiment. As in the first and second exemplary embodiments, a case in which the duty register 120 is structured by 8 bits (set value=0 to 255) will be described with reference to specific numeric values.

FIG. 11A shows a timing chart in the case of the duty register value=192, that is, in the case of the duty ratio=192/255×100≈75%.

First, in the chopping wave, when the coincidence signal is at the low level, the voltage of a sawtooth wave 1 (output of the first sawtooth generator 135) increases, and a sawtooth wave 2 (output of the second sawtooth generator 136) is fixed to the low level. When the coincidence signal is at the high level, the voltage of the sawtooth wave 2 increases, and the sawtooth wave 1 is fixed to the low level. As a result, the chopping wave is alternately generated every one period of the coincidence signal.

Then, in the outputs of the first comparator 138 and the second comparator 139, due to the same principle as that of the first exemplary embodiment, the PWM waveform with the duty ratio of the low level being 75% is alternately output from the first comparator 138 and the second comparator 139, respectively.

Due to the NOR of the signals generated on the basis of the respective outputs of the first comparator 138 and the second comparator 139, the PWM output with the duty ratio of the high level being 70% can be generated. When not NOR but OR is applied, the PWM output with the duty ratio of the low level being 75% can be generated.

FIG. 11B shows a timing chart in the case where the period register value is equivalent to that in FIG. 11A, and the duty register value is changed to 85, that is, in the case of the duty ratio=85/255×100≈33%. In this case, due to the same principle as that in FIG. 11A, the PWM waveform with the duty ratio of the high level being 33% is outputted.

FIG. 11C is a timing chart in the case where the duty register value is equivalent to that in FIG. 11B, and the period register value is set to ½. In this case, due to the same principle as that in the first and second exemplary embodiments, the PWM output with the duty ratio of the high level being 33% is realized even with a change in the period.

A mechanism that is capable of solving the problem with the related art according to the configuration of the third exemplary embodiment is identical with that in the first exemplary embodiment of the present invention.

The feature of the third exemplary embodiment resides in the configuration in which two sawtooth waves are used to change the period by inversion of the low level and the high level of the coincidence signal, and the coincidence signal whose active width is close to 0 without limit, which is a problem with the first exemplary embodiment, is not required. Also, there is realized the configuration in which a precision in the duty ratio of the PWM output is not deteriorated even when the sawtooth wave does not drop from the maximum voltage to the minimum voltage in 0 seconds with the use of the logical AND of the sawtooth wave and the coincidence signal (or coincidence signal that has been logically inverted) as the output signal.

Figure 12:
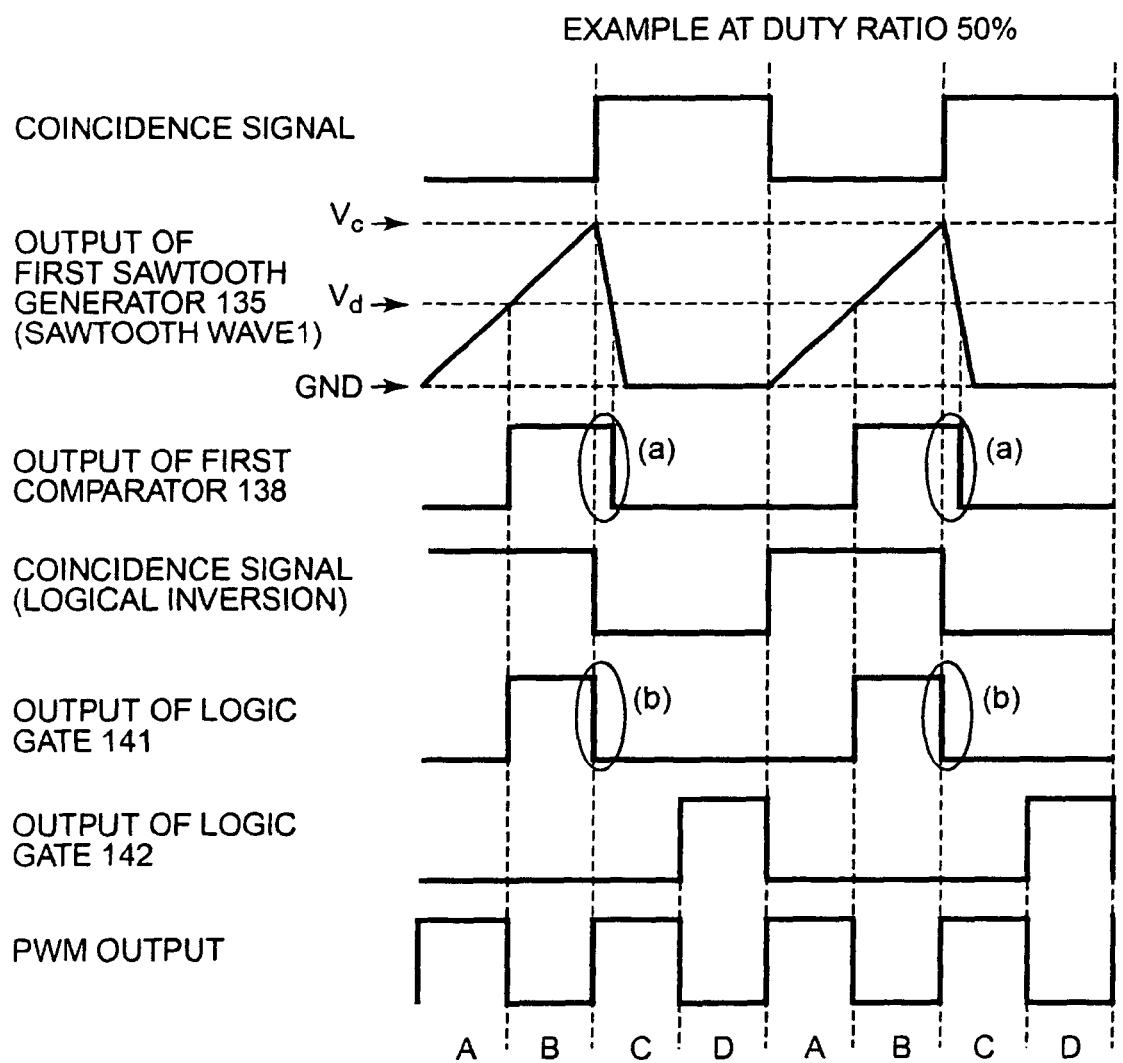
FIG. 12 is a diagram showing a timing chart when a voltage drop waveform is not ideal according to the third exemplary embodiment of the present invention.
Figure 13:
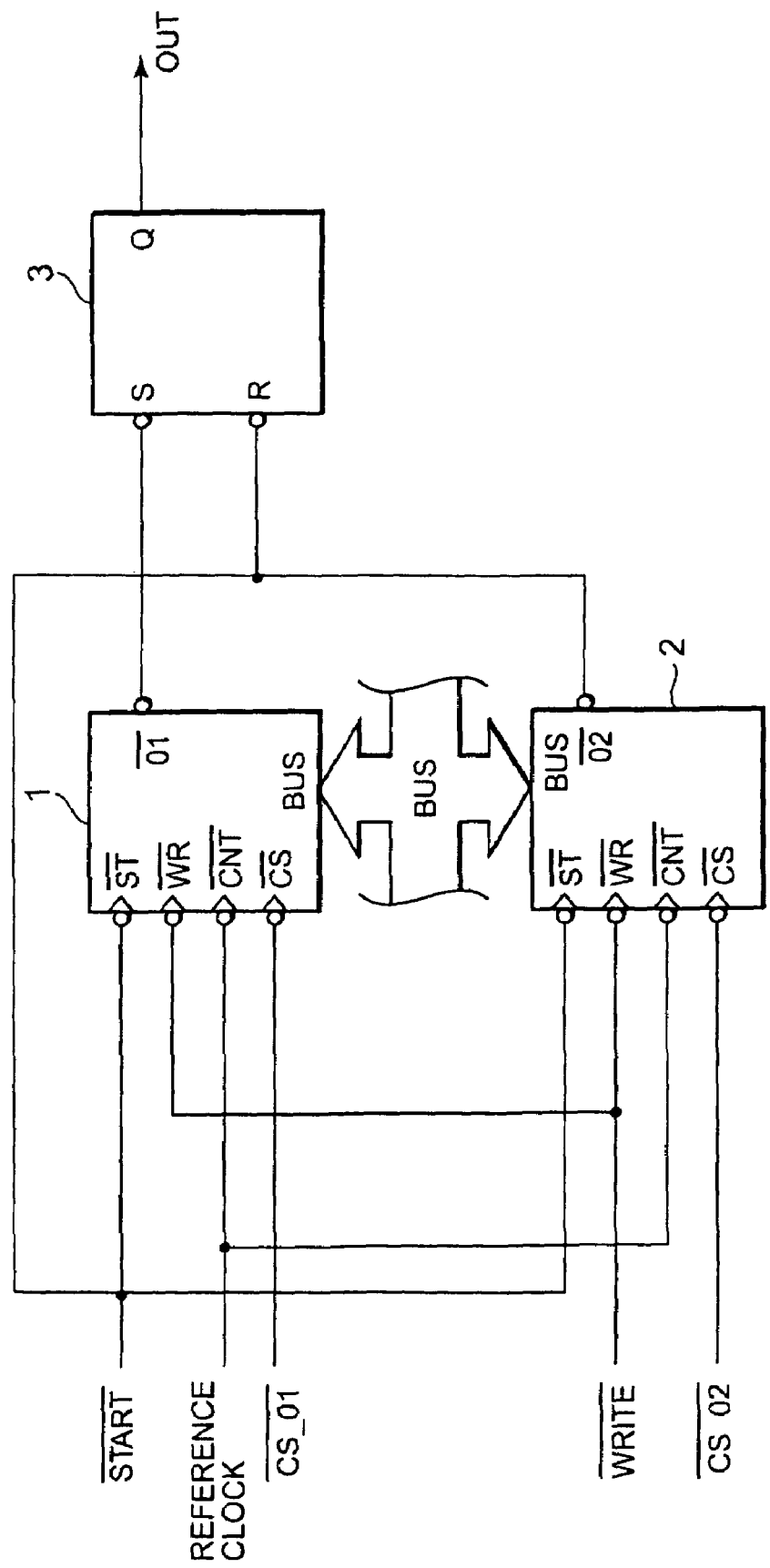
FIG. 13 is a diagram showing a configuration of a pulse generating device in a related art.
Figure 14:
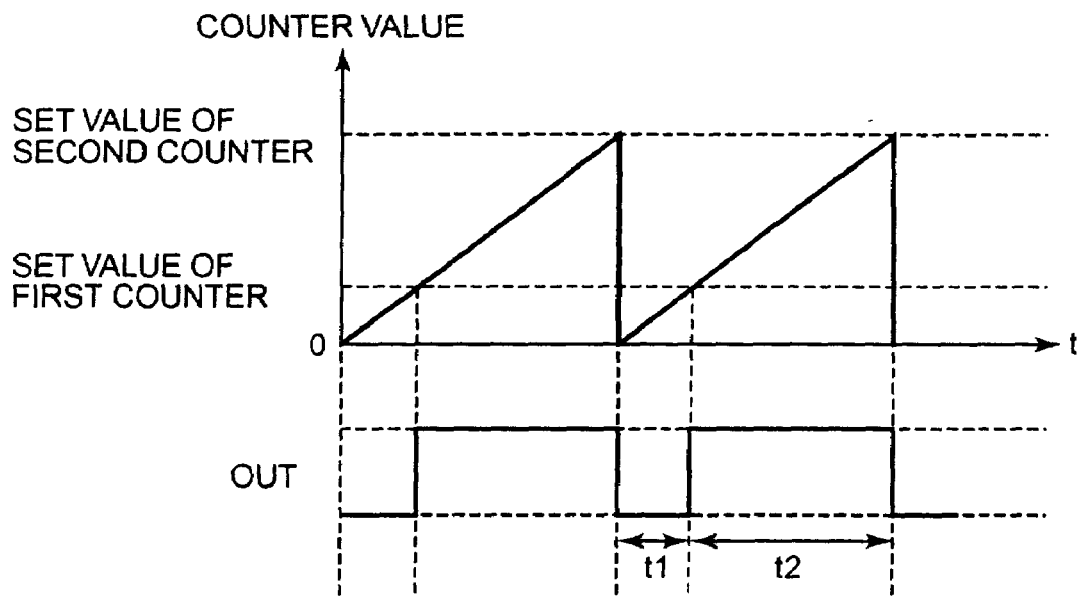
FIG. 14 is a diagram showing a timing chart of the pulse generating device of FIG. 13.
Figure 15:
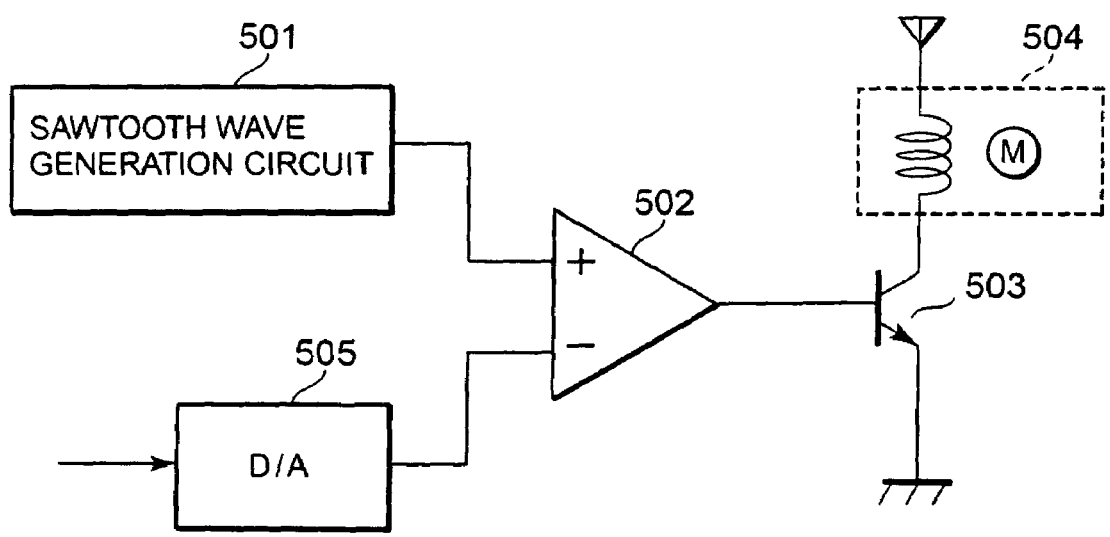
FIG. 15 is a diagram showing a configuration of a pulse generating device in another related art.

With an aim to specifically express the above operation, FIG. 12 shows a timing chart of the third exemplary embodiment when the voltage drop waveform of the sawtooth wave is not ideal. An example in which the duty ratio is set to 50% is shown. The coincidence signal becomes the high level, and the output of the first sawtooth generator 135 drops at the same time when the subsequent PWM period starts.

In this case, when the voltage drop waveform is inclined, the output of the first comparator 138 is maintained at the high level as shown at a part (a) of a waveform of the output of the first comparator 138 in FIG. 12 until the voltage reaches Vd, and the duty ratio is farther from 50% as that time is longer. However, when the logical AND of the output of the first comparator 138 and the coincidence signal that has been logically inverted is used as the output signal, an unnecessary high level is removed from the output of the logic gate 141 as shown at a part (b) of a waveform of the output of the logic gate 141 in FIG. 12, thereby enabling a desired duty ratio (50% in this case).

Likewise, when the logical AND of the output of the second comparator 139 and the coincidence signal is used as the output signal, the output of the logic gate 142 can obtain a waveform from which an unnecessary high level has been removed. As a result, a desired duty ratio (50% in this case) is enabled. With the above mechanism, there can be solved such a problem that a precision in the duty ratio of the PWM output is deteriorated when the sawtooth wave does not drop from the maximum voltage to the minimum voltage in 0 seconds (instantaneously). Then, since one period of the PWM waveform is outputted in one period of the sawtooth wave, it is possible to change the period of the PWM output every one period, and there can be solved such a problem that the period of the PWM output can be changed only every 2 periods in the second exemplary embodiment.

Other features that the number of steps of the settable duty ratio is not changed even if the period is changed, and the entirely same duty ratio can be retained are identical with those in the first and second exemplary embodiments.

Therefore, the present invention has the feature that the signal is outputted from the period setting unit 11 to the duty ratio setting unit 12, and the D/A converters 121, 122 with the two-stage structure is mounted in the duty ratio setting unit 12, thereby realizing that the duty ratio always satisfies "(set value of the duty register 120)/(maximum set value of the duty register 120)". Accordingly, there is realized a configuration in which the duty ratio is determined according to only the set value of the duty register 120 regardless of a change in the frequency of the PWM output, and the duty ratio can be retained without a load on the CPU.

As has been described above, the present invention has the following advantages. Even when the period of the PWM output is changed, the same duty ratio is retained without exerting a load such as CPU processing, and the duty ratio can be always retained to "(set value of the duty register 120)/(maximum set value of the duty register 120)". Also, even when the period of the PWM output is changed, the number of steps of the settable duty ratio is not changed, and becomes always the maximum set value of the duty register 120. As a result, the same duty ratio can be always retained.

Although the invention has been described above in connection with several exemplary embodiments thereof, it will be appreciated by those skilled in the art that those exemplary embodiments is provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A pulse signal generator, comprising:
a period setting unit that receives a period set signal including an information indicative of a pulse period, and that outputs a period control signal controlling the pulse period;
a duty ratio setting unit that receives a duty ratio set signal including an information indicative of a duty ratio of a pulse, that receives a signal including the pulse period set in the period setting unit, and that generates a duty ratio control signal controlling the duty ratio of the pulse on a basis of the pulse period and the duty ratio set signal; and
a pulse generation unit that comprises a comparator,
wherein the comparator compares a signal indicative of a voltage level value changed in response to the period control signal with the duty ratio control signal to generate a comparison result signal,
wherein the pulse generation unit generates a pulse signal including the pulse period and the duty ratio of the pulse on a basis of the comparison result signal, and
wherein the duty ratio setting unit generates a potential corresponding to the signal including the pulse period set in the period setting unit, and divides the potential on a basis of the duty ratio set signal to generate the duty ratio control signal.

2. The pulse signal generator according to claim 1, wherein the duty ratio setting unit generates the duty ratio control signal so that the duty ratio of the pulse signal generated in the pulse generation unit becomes equal to the duty ratio set by the duty ratio set signal.

3. A pulse signal generator, comprising:
a period setting unit that receives a period set signal including an information indicative of a pulse period, and that outputs a period control signal controlling the pulse period;
a duty ratio setting unit that receives a duty ratio set signal including an information indicative of a duty ratio of a pulse, that receives a signal including the pulse period set in the period setting unit, and that generates a duty ratio control signal controlling the duty ratio of the pulse on a basis of the pulse period and the duty ratio set signal; and a pulse generation unit that generates a pulse signal including the pulse period and the duty ratio of the pulse on a basis of the period control signal and the duty ratio control signal, wherein the pulse generation unit comprises:

an integral signal generation unit that generates an integral signal including a voltage level value continuously increased or decreased with respect to each pulse period specified by the period control signal; and a comparator that compares the integral signal with the duty ratio control signal output from the duty ratio setting unit, and that outputs a comparison result signal, and wherein the pulse signal is generated based on the comparison result signal.

4. The pulse signal generator according to claim 3, wherein the duty ratio setting unit generates the duty ratio control signal so that the duty ratio control signal includes a voltage change width corresponding to a voltage change width of the integral signal generated in the integral signal generation unit.

5. The pulse signal generator according to claim 3, wherein the duty ratio setting unit determines a maximum voltage level of the duty ratio control signal according to the pulse period.

6. The pulse signal generator according to claim 3, wherein the duty ratio setting unit comprises:

a first digital-to-analog (D/A) converter that determines a maximum voltage level of the duty ratio control signal according to the pulse period set in the period setting unit; and a second D/A converter that controls a voltage level of the duty ratio control signal according to the duty ratio set signal.

7. The pulse signal generator according to claim 3, wherein the comparator comprises a first comparator, wherein the period setting unit includes:

a counter that outputs a count value according to a count clock signal; and a second comparator that compares the count value output from the counter with the pulse period, and that outputs a coincidence signal, and wherein the integral signal generation unit of the pulse generation unit receives the coincidence signal as the period control signal, generates a sawtooth wave, and outputs the sawtooth wave as the integral signal.

8. The pulse signal generator according to claim 3, wherein the comparator comprises a first comparator, and wherein the period setting unit includes:

a counter that outputs a count value according to a count clock signal;

a second comparator that compares the count value output from the counter with the pulse period, and that outputs a coincidence signal; and an inversion signal generation unit that inverts a voltage level of a signal value with respect to each coincidence signal to output an inversion signal as the period control signal.

9. The pulse signal generator according to claim 8, wherein the integral signal generation unit of the pulse generation unit generates a chopping wave, and outputs the chopping wave as the integral signal.

10. The pulse signal generator according to claim 8, wherein the integral signal generation unit comprises a first integral signal generation unit, wherein the pulse generation unit further comprises:

a second integral signal generation unit that generates an integral signal including a voltage level value continuously increased or decreased with respect to each pulse period specified by an inverted signal of the period control signal; and a third comparator that compares the integral signal from the second integral signal generation unit with the duty ratio control signal output from the duty ratio setting unit, and that outputs a comparison result signal, and wherein the pulse signal is generated based on the comparison result signal from the first comparator and the comparison result signal from the second comparator.

11. The pulse signal generator according to claim 10, wherein the first integral signal generation unit and the second integral signal generation unit respectively generate a sawtooth wave, and respectively output the sawtooth wave as the integral signal, and wherein a phase difference between the sawtooth wave from the first integral signal generation unit and the sawtooth wave from the second integral signal generation unit comprises a half cycle of the sawtooth wave.

12. A pulse signal generator, comprising:

a period control unit which compares a count value with a period set value to generate a coincidence signal;

a duty ratio control unit which generates a first potential corresponding to the period set value, and which divides the first potential on a basis of a duty set value to generate a second potential; and an output unit which includes an integrator which receives the coincidence signal, and which compares an output signal from the integrator with the second potential to generate a pulse signal.

13. The pulse signal generator according to claim 12, wherein the period control unit generates the coincidence signal with a first potential level when the period set value does not coincide with the count value, and generates the coincidence signal with a second potential level when the period set value coincides with the count value, and wherein the integrator generates the output signal with a sawtooth wave.

14. The pulse signal generator according to claim 12, wherein the period control unit generates the coincidence signal with a first potential level and a second potential level, and switches between the first potential level and the second potential level every time the period set value coincides with the count value, and wherein the integrator generates the output signal with a chopping wave.

15. The pulse signal generator according to claim 12, wherein the period control unit generates the coincidence signal with a first potential level and a second potential level, and switches between the first potential level and the second potential level every time the period set value coincides with the count value, wherein the integrator comprises a first integrator, wherein the output unit further includes a second integrator which receives an inverted signal of the coincidence signal, and which compares an output signal from the second integrator with the second potential, and wherein the pulse signal is generated based on a result of a comparison of the output signal from the first integrator with the second potential and a result of a comparison of the output signal from the second integrator with the second potential.

16. The pulse signal generator according to claim 15, wherein the first integrator and the second integrator respectively generate the output signal with a sawtooth wave.

17. The pulse signal generator according to claim 12, wherein a maximum amplitude of the output signal from the integrator corresponds to the first potential.

18. The pulse signal generator according to claim 12, wherein the duty ratio control unit includes a first digital-to-analog (D/A) converter and a second D/A converter,
wherein the first D/A converter generates the first potential in response to the period set value, and
wherein the second D/A converter divides the first potential on the basis of the duty set value to generate the second potential.

19. A method of generating a pulse signal, comprising:
counting a clock signal to generate a count value;
comparing the count value with a period set value to generate a coincidence signal;
generating a first potential corresponding to the period set value;
dividing the first potential on a basis of a duty set value to generate a second potential;
integrating the coincidence signal to generate a signal of an integral wave; and
comparing the signal of the integral wave with the second potential to generate the pulse signal.

20. The method of generating the pulse signal according to claim 19, wherein a maximum amplitude of the signal of the integral wave corresponds to the first potential.

* * * * *